US010685663B2

(12) United States Patent
Karkkainen et al.

(10) Patent No.: US 10,685,663 B2
(45) Date of Patent: Jun. 16, 2020

(54) ENABLING IN-EAR VOICE CAPTURE USING DEEP LEARNING

(71) Applicant: Nokia Technologies Oy, Espoo (FI)

(72) Inventors: Asta Maria Karkkainen, Helsinki (FI); Leo Mikko Johannes Karkkainen, Helsinki (FI); Mikko Honkala, Espoo (FI); Sampo Vesa, Helsinki (FI)

(73) Assignee: Nokia Technologies Oy, Espoo (FI)

(*) Notice: Subject to any disclaimer, the term of this patent is extended or adjusted under 35 U.S.C. 154(b) by 232 days.

(21) Appl. No.: 15/956,457

(22) Filed: Apr. 18, 2018

(65) Prior Publication Data

US 2019/0325887 A1 Oct. 24, 2019

(51) Int. Cl.

| | |
|---|---|
| ***H03B 29/00*** | (2006.01) |
| ***G10L 21/0208*** | (2013.01) |
| ***G10K 11/16*** | (2006.01) |
| *G10L 25/84* | (2013.01) |

(52) U.S. Cl.

CPC .......... *G10L 21/0208* (2013.01); *G10K 11/16* (2013.01); *G10L 25/84* (2013.01)

(58) Field of Classification Search

CPC ...................................................... H03B 29/00

See application file for complete search history.

(56) References Cited

U.S. PATENT DOCUMENTS

| | | | | |
|---|---|---|---|---|
| 9,253,560 | B2 * | 2/2016 | Goldstein | G06F 16/686 |
| 9,640,194 | B1 | 5/2017 | Nemala et al. | |
| 2008/0112569 | A1 * | 5/2008 | Asada | G10K 11/178 381/71.1 |
| 2011/0135106 | A1 | 6/2011 | Yehuday et al. | |
| 2012/0084084 | A1 * | 4/2012 | Zhu | G10L 21/0208 704/233 |
| 2015/0063575 | A1 * | 3/2015 | Tan | G06F 16/683 381/56 |
| 2016/0351203 | A1 | 12/2016 | Tan et al. | |
| 2017/0178668 | A1 | 6/2017 | Kar et al. | |
| 2017/0249954 | A1 | 8/2017 | Kim | |
| 2018/0367882 | A1 * | 12/2018 | Watts | H04R 1/1041 |
| 2019/0037298 | A1 * | 1/2019 | Reily | H04R 5/033 |
| 2019/0043491 | A1 * | 2/2019 | Kupryjanow | G10L 21/0232 |
| 2019/0080710 | A1 * | 3/2019 | Zhang | G10K 11/175 |
| 2019/0130926 | A1 * | 5/2019 | Giri | G10L 21/0216 |

(Continued)

OTHER PUBLICATIONS

Pascual, S. et al. Segan: Speech Enhancement Generative Adversarial Network. In: arXiv.org [online], Jun. 9, 2017 [retrieved on Jul. 1, 2019-07]. Retrieved from https://arxiv.org/abs/1703.09452, abstract; sections 1,3,4.1-4.2, 5.1; fig 2.

(Continued)

*Primary Examiner* — Olisa Anwah

(74) *Attorney, Agent, or Firm* — Harrington & Smith

(57) ABSTRACT

A method includes accessing, by at least one processing device, an audible signal including at least one in-ear microphone audible signal and at least one external microphone audible signal and at least one noise signal; training a generative network to generate an enhanced external microphone signal from an in-ear microphone signal based on the at least one in-ear microphone audible signal and the at least one external microphone audible signal; and outputting the generative network.

20 Claims, 14 Drawing Sheets

(56) References Cited

U.S. PATENT DOCUMENTS

| | | | | |
|---|---|---|---|---|
| 2019/0209038 | A1* | 7/2019 | Saab | A61B 5/6815 |
| 2019/0222691 | A1* | 7/2019 | Shah | G10L 21/0208 |

OTHER PUBLICATIONS

Sriram, A. et al. Robust Speech Recognition Using Generative Adversarial Networks. In: arXiv.org [online], Nov. 5, 2017, [retrieved on Jul. 1, 2019]. Retrieved from https://arxiv.org/abs/1711.01567, abstract; sections 3.1-3.2; eq. 1-2; Alg. 1.

Creswell, A. et al. Generative Adversarial Networks: An Overview. In: arXiv.org [online], Oct. 19, 2017, [retrieved on Jul. 1, 2019]. Retrieved from https://arxiv.org/abs/1710.07035, abstract, sections III.B, III.E.

"The Future of Voice Computing is in the Ear" https://www.smartear.ai/ [retrieved Apr. 19, 2018].

Patrick Kechichian and Sriram Srinivasam "Model-based Speech Enhancement Using a Bone-Conducted Signal" Feb. 23, 2012 http://asa.scitation.org/doi/pdf/10.1121/1.3687014.

Mingzi Li "Multisensory Speech Enhancement in Noisy Environments Using Bone-Conducted and Air-Conducted Mircophones" Nov. 2013 <http://webee.technion.ac.il/people/IsraelCohen/Info/Graduates/PDF/MingziLi_MSc_2013.pdf >.

Juian Horsey "Ripplebuds Noise Blocking Earbuds Fitted with In-ear Mic" Mar. 22, 2016 <https://www.geeky-gadgets.com/ripplebuds-noise-blocking-earbuds-fitted-with-in-ear-mic-Mar. 22, 2016/>.

"In-ear Voice Capture" http://think-a-move.com/page_id=14 [retrieved Apr. 19, 2018].

* cited by examiner

ENABLING IN-EAR VOICE CAPTURE USING DEEP LEARNING

TECHNOLOGICAL FIELD

The exemplary and non-limiting embodiments relate generally to speech capture and audio signal processing, particularly headphone, and microphone signal processing.

BACKGROUND

Recognition of the sound from person's mouth (for example, speech, singing, etc.) using in-ear microphone and conventional signal processing is difficult because of the complexity of noisy systems. Audio, particularly speech, may be recorded and output via headphone and/or microphones. Signal processing for in-ear recording of audio may include application of an artificial bandwidth extension (ABE).

Certain abbreviations that may be found in the description and/or in the Figures are herewith defined as follows:

3GPP Third Generation Partnership Project 5G 5th generation mobile networks (or wireless systems)

gNB gNodeB

LTE Long Term Evolution

MM Mobility Management

MTC machine type communications

NR New Radio

SGW Serving GW

BRIEF SUMMARY

This section is intended to include examples and is not intended to be limiting.

In an example of an embodiment, a method is disclosed that includes accessing, by at least one processing device, a real noise-free audible signal including at least one real in-ear microphone audible signal and at least one real external microphone audible signal and at least one noise signal; training a generative network to generate an external microphone signal from an in-ear microphone signal based on the at least one real in-ear microphone audible signal and the at least one real external microphone audible signal; and outputting the generative network.

In an example of an embodiment, a method is disclosed that includes receiving, by an outside-the-ear microphone, a room sound transfer of at least one audio signal of interest and at least one noise signal; receiving, by an in-ear microphone, an in-body transfer of at least one audio signal of interest and the at least one noise signal, and an incoming audio signal; performing incoming audio cancellation on an output of the in-ear microphone; and performing deep learning inference based on an output of the incoming audio cancellation, an output of the outside-the-ear microphone and a pre-trained deep learning model to determine a noise-free (for example, clean) natural sound.

An example of an apparatus includes at least one processor; and at least one non-transitory memory including computer program code, the at least one memory and the computer program code configured to, with the at least one processor, cause the apparatus to access a real noise-free audible signal including at least one real in-ear microphone audible signal and at least one real external microphone audible signal and at least one noise signal; train a generative network to generate an external microphone signal from an in-ear microphone signal based on the at least one real in-ear microphone audible signal and the at least one real external microphone audible signal; and output the generative network.

An example of an apparatus includes at least one processor; and at least one non-transitory memory including computer program code, the at least one memory and the computer program code configured to, with the at least one processor, cause the apparatus to receive, by an outside-the-ear microphone, a room sound transfer of at least one audio signal of interest and at least one noise signal; receive, by an in-ear microphone, an in-body transfer of at least one audio signal of interest and the at least one noise signal, and an incoming audio signal; perform incoming audio cancellation on an output of the in-ear microphone; and perform deep learning inference based on an output of the incoming audio cancellation, an output of the outside-the-ear microphone and a pre-trained deep learning model to determine a clean natural sound.

BRIEF DESCRIPTION OF THE DRAWINGS

The foregoing and other aspects of embodiments of this invention are made more evident in the following Detailed Description, when read in conjunction with the attached Drawing Figures, wherein.

DETAILED DESCRIPTION OF THE DRAWINGS

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

In the example embodiments as described herein a method and apparatus may perform speech capture that provides accurate and real-time audible (for example, speech) signal modeling and enhancement in order to achieve natural speech recording and transfer by deep learning and deep generative modeling using at least an in-ear microphone signal. Deep learning is a class of machine learning algorithms that uses a cascade of multiple layers of nonlinear processing units for feature extraction and transformation. Each successive layer may use the output from the previous layer as input. Deep learning systems may learn in supervised (for example, classification) and/or unsupervised (for example, pattern analysis) manners. Deep learning systems may learn multiple levels of representations that correspond to different levels of abstraction; and the levels in deep learning may form a hierarchy of concepts. A Deep Generative model is a generative model that is implemented using deep learning.

Figure 1:
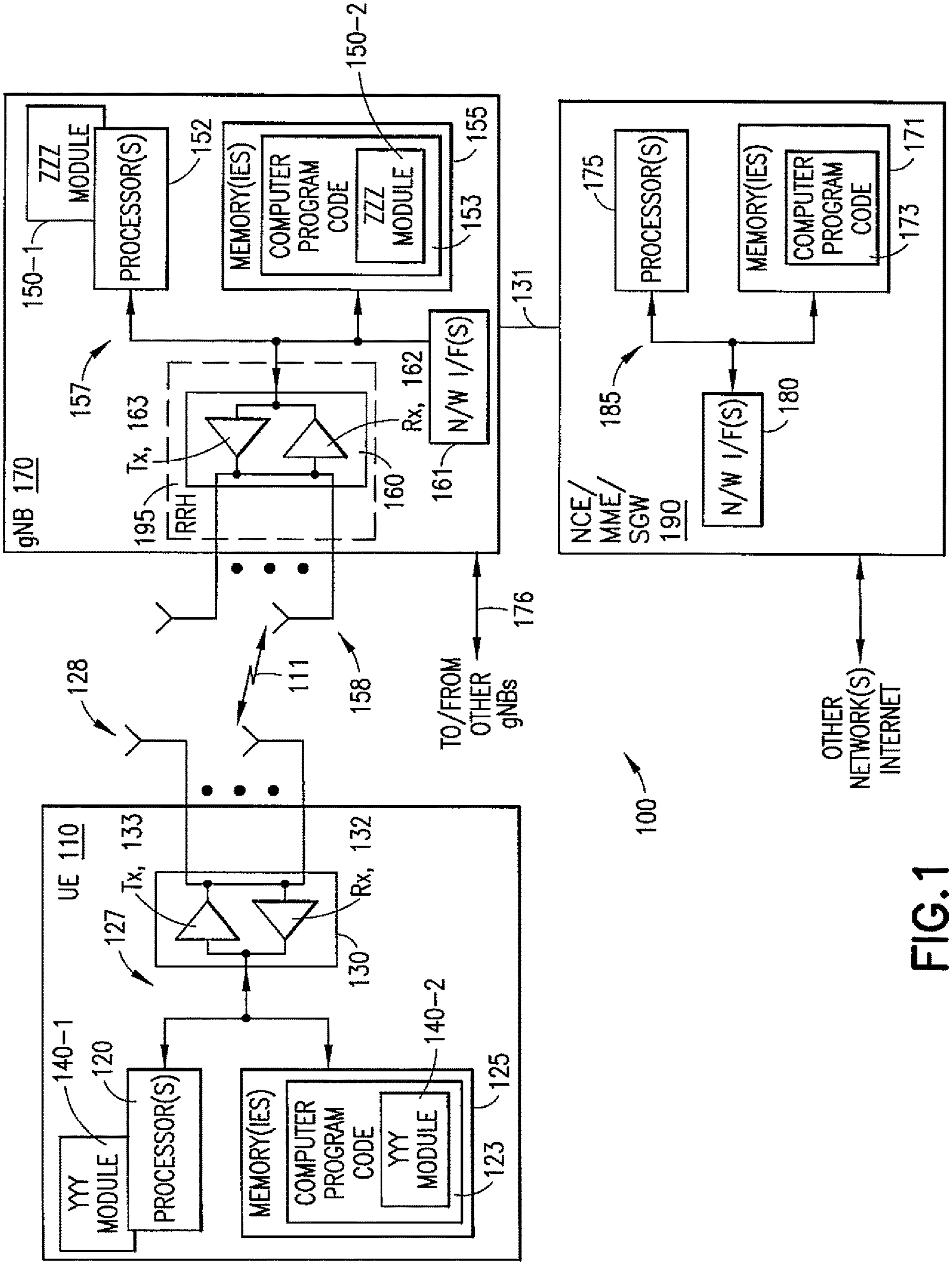
FIG. 1 is a block diagram of one possible and non-limiting example system in which the example embodiments may be practiced.

Turning to FIG. 1, this figure shows a block diagram of one possible and non-limiting example system in which the example embodiments may be practiced. In FIG. 1, a user equipment (UE) 110 is in wireless communication with a wireless network 100. A UE is a wireless, typically mobile device that can access a wireless network. The UE 110 includes one or more processors 120, one or more memories 125, and one or more transceivers 130 interconnected through one or more buses 127. Each of the one or more transceivers 130 includes a receiver, Rx, 132 and a transmitter, Tx, 133. The one or more buses 127 may be address, data, or control buses, and may include any interconnection mechanism, such as a series of lines on a motherboard or integrated circuit, fiber optics or other optical communication equipment, and the like. The one or more transceivers 130 are connected to one or more antennas 128. The one or more memories 125 include computer program code 123. The UE 110 includes a YYY module 140, comprising one of or both parts 140-1 and/or 140-2, which may be implemented in a number of ways. The YYY module 140 may be implemented in hardware as signaling module 140-1, such as being implemented as part of the one or more processors 120. The signaling module 140-1 may be implemented also as an integrated circuit or through other hardware such as a programmable gate array. In another example, the YYY module 140 may be implemented as YYY module 140-2, which is implemented as computer program code 123 and is executed by the one or more processors 120. For instance, the one or more memories 125 and the computer program code 123 may be configured to, with the one or more processors 120, cause the user equipment 110 to perform one or more of the operations as described herein. The UE 110 communicates with gNB 170 via a wireless link 111.

The gNB (NR/5G Node B but possibly an evolved NodeB) 170 is a base station (e.g., for LTE, long term evolution) that provides access by wireless devices such as the UE 110 to the wireless network 100. The gNB 170 includes one or more processors 152, one or more memories 155, one or more network interfaces (N/W I/F(s)) 161, and one or more transceivers 160 interconnected through one or more buses 157. Each of the one or more transceivers 160 includes a receiver, Rx, 162 and a transmitter, Tx, 163. The one or more transceivers 160 are connected to one or more antennas 158. The one or more memories 155 include computer program code 153. The gNB 170 includes a ZZZ module 150, comprising one of or both parts 150-1 and/or 150-2, which may be implemented in a number of ways. The ZZZ module 150 may be implemented in hardware as ZZZ module 150-1, such as being implemented as part of the one or more processors 152. The ZZZ module 150-1 may be implemented also as an integrated circuit or through other hardware such as a programmable gate array. In another example, the ZZZ module 150 may be implemented as ZZZ module 150-2, which is implemented as computer program code 153 and is executed by the one or more processors 152. For instance, the one or more memories 155 and the computer program code 153 are configured to, with the one or more processors 152, cause the gNB 170 to perform one or more of the operations as described herein. The one or more network interfaces 161 communicate over a network such as via the links 176 and 131. Two or more gNBs 170 (or gNBs and eNBs) communicate using, e.g., link 176. The link 176 may be wired or wireless or both and may implement, e.g., an X2 interface.

The one or more buses 157 may be address, data, or control buses, and may include any interconnection mechanism, such as a series of lines on a motherboard or integrated circuit, fiber optics or other optical communication equipment, wireless channels, and the like. For example, the one or more transceivers 160 may be implemented as a remote radio head (RRH) 195, with the other elements of the gNB 170 being physically in a different location from the RRH, and the one or more buses 157 could be implemented in part as fiber optic cable to connect the other elements of the gNB 170 to the RRH 195.

It is noted that description herein indicates that "cells" perform functions, but it should be clear that the gNB that forms the cell will perform the functions. The cell makes up part of a gNB. That is, there can be multiple cells per gNB.

The wireless network 100 may include a network control element (NCE) 190 that may include MME (Mobility Management Entity)/SGW (Serving Gateway) functionality, and which provides connectivity with a further network, such as a telephone network and/or a data communications network (e.g., the Internet). The gNB 170 is coupled via a link 131 to the NCE 190. The link 131 may be implemented as, e.g., an Si interface. The NCE 190 includes one or more processors 175, one or more memories 171, and one or more network interfaces (N/W I/F(s)) 180, interconnected through one or more buses 185. The one or more memories 171 include computer program code 173. The one or more memories 171 and the computer program code 173 are configured to, with the one or more processors 175, cause the NCE 190 to perform one or more operations.

The wireless network 100 may implement network virtualization, which is the process of combining hardware and software network resources and network functionality into a single, software-based administrative entity, a virtual network. Network virtualization involves platform virtualization, often combined with resource virtualization. Network virtualization is categorized as either external, combining many networks, or parts of networks, into a virtual unit, or internal, providing network-like functionality to software containers on a single system. Note that the virtualized entities that result from the network virtualization are still implemented, at some level, using hardware such as processors 152 or 175 and memories 155 and 171, and also such virtualized entities create technical effects.

The computer readable memories 125, 155, and 171 may be of any type suitable to the local technical environment and may be implemented using any suitable data storage technology, such as semiconductor based memory devices, flash memory, magnetic memory devices and systems, optical memory devices and systems, fixed memory and removable memory. The computer readable memories 125, 155, and 171 may be means for performing storage functions. The processors 120, 152, and 175 may be of any type suitable to the local technical environment, and may include one or more of general purpose computers, special purpose computers, microprocessors, digital signal processors (DSPs) and processors based on a multi-core processor architecture, as non-limiting examples. The processors 120, 152, and 175 may be means for performing functions, such as controlling the UE 110, gNB 170, and other functions as described herein.

In general, the various embodiments of the user equipment 110 can include, but are not limited to, cellular telephones such as smart phones, tablets, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, tablets with wireless communication capabilities, as well as portable units or terminals that incorporate combinations of such functions.

Some example embodiments herein may be implemented in software (executed by one or more processors), hardware (e.g., an application specific integrated circuit), or a combination of software and hardware. In an example of an embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 1. A computer-readable medium may comprise a computer-readable storage medium or other device that may be any media or means that can contain or store the instructions for use by or in connection with an instruction execution system, apparatus, or device, such as a computer.

The current architecture in LTE networks is fully distributed in the radio and fully centralized in the core network. The low latency requires bringing the content close to the radio which leads to local break out and multi-access edge computing (MEC). 5G may use edge cloud and local cloud architecture. Edge computing covers a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services and augmented reality. In radio communications, using edge cloud may mean node operations to be carried out, at least partly, in a server, host or node operationally coupled to a remote radio head or base station comprising radio parts. It is also possible that node operations will be distributed among a plurality of servers, nodes or hosts. It should also be understood that the distribution of labor between core network operations and base station operations may differ from that of the LTE or even be non-existent. Some other technology advancements probably to be used are Software-Defined Networking (SDN), Big Data, and all-IP, which may change the way networks are being constructed and managed.

Having thus introduced one suitable but non-limiting technical context for the practice of the example embodiments of this invention, the example embodiments will now be described with greater specificity.

Figure 2:
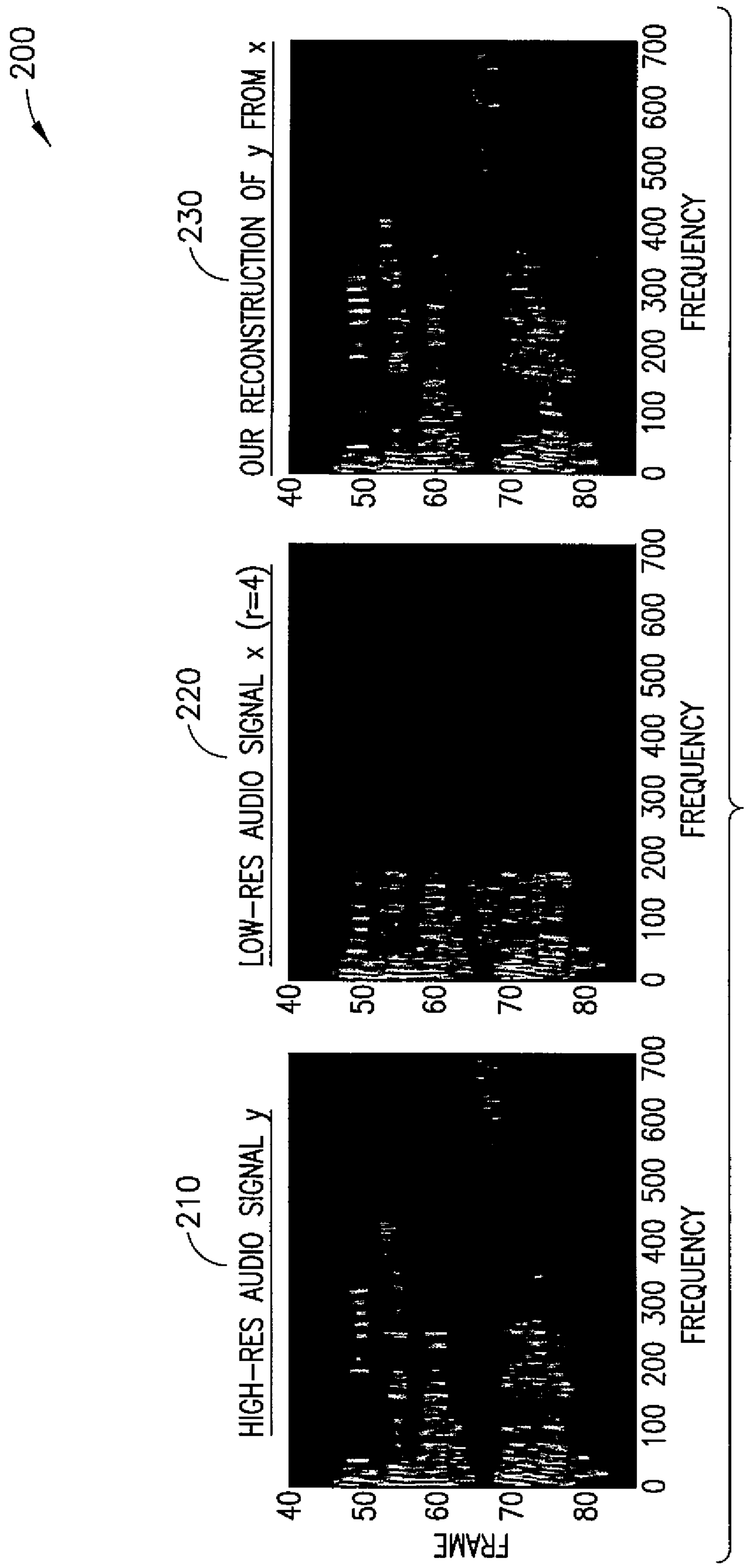
FIG. 2 illustrates an example embodiment of audio super-resolution using spectrograms.

FIG. 2 illustrates an example embodiment of audio super-resolution using spectrograms 200. X axis represents a frequency bin (for example, a discrete frequency in a Fourier transform).

As shown in FIG. 2, a high-quality audible (for example, speech) signal (210) may be subsampled at r=4, resulting in the loss of high frequencies (220). For r=4, the sampling rate may be decreased (a procedure also known as down-sampling) by a factor of 4 resulting in a frequency range up to only ¼ of the original. The recovered signal may be generated using a trained neural network (230), for example, audio super-resolution using neural nets. Artificial Bandwidth Extension (ABE) implemented using deep learning may outperform baselines (at 2×, 4×, and 6× upscaling ratios) on standard speech and music datasets. This audio super-resolution may be implemented using neural nets. In some example embodiments, the processing may include using deep learning, and annotated data.

According to example embodiments, the systems and methods described herein may enhance, remove/reduce or manage the sound pressure level of a person's (own) voice when recording sound using a wearable microphone system. Similarly, as described herein below, ABE may be applied to signals such as subsampled signal 220 to determine a recovered signal 230, which may substantially correspond to the original high resolution signal 210.

Deep learning may provide for both artificial band width extension (ABE) and noise reduction (for example, denoising). In-ear voice capture may require a different setup than external microphones because of the 1) recording in a closed or partly open cavity (low-pass filtering effect which requires ABE to be solved), 2) noise (external noise, internal body noises, for example, breath and heart) and 3) changing response due to differences in producing sound (different vowels and consonants). The example embodiments described herein may counteract the low-pass filtering effect by high-pass filtering, for example, filtering with the inverse of the low-pass filter.

Figure 3:
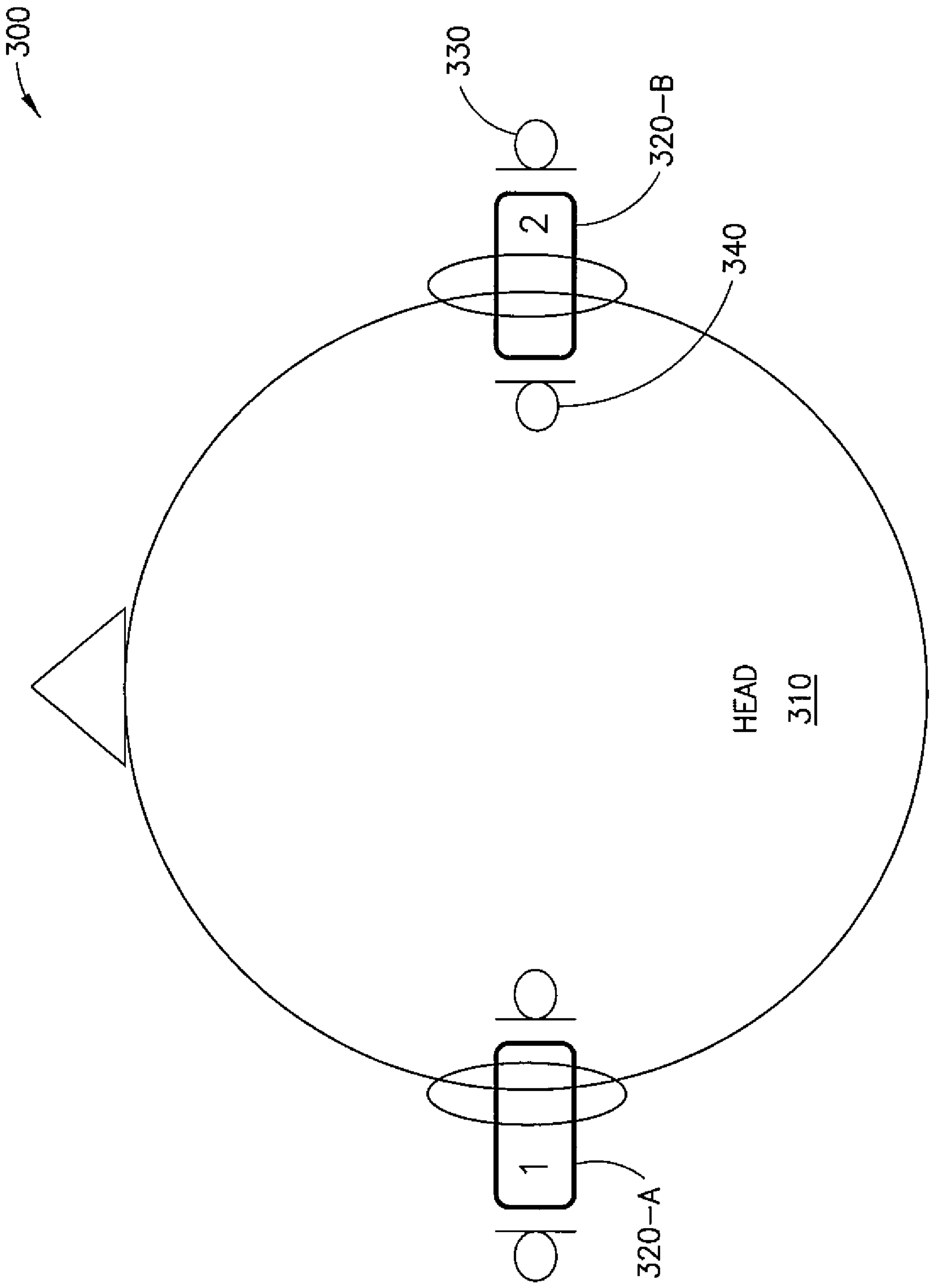
FIG. 3 illustrates an example embodiment of a head with and headsets and in-ear microphone.

FIG. 3 illustrates an example embodiment of (an audio capture setup that includes) a head 310 and headsets on the left and right ears (left and right headset 320-L and 320-R (1, 2)) and an in-ear microphone (340) and an outside-the-ear microphone (330).

Figure 4:
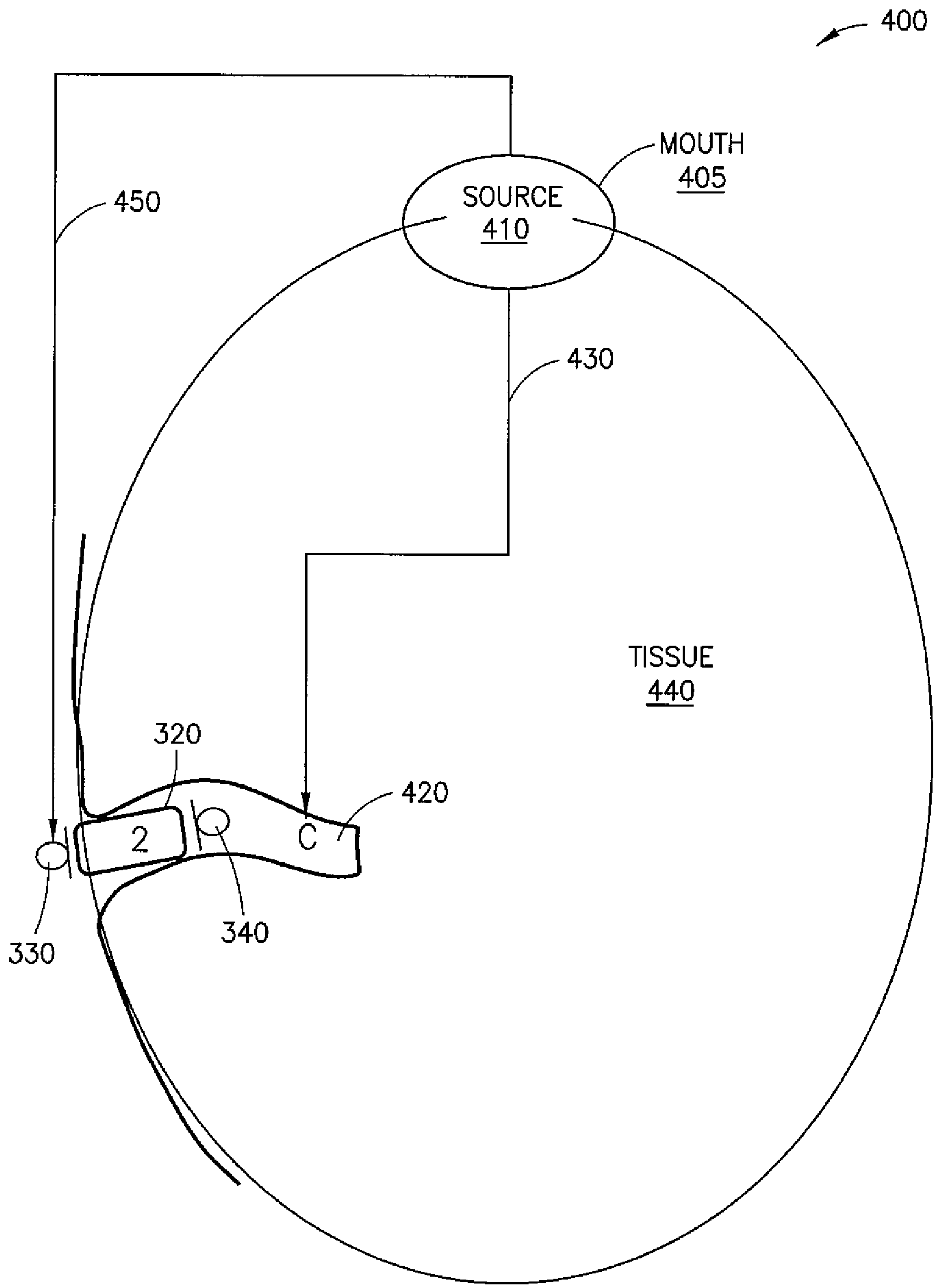
FIG. 4 illustrates an example embodiment of a head with a sound source is in a person's mouth.

In addition to directly (or, right) outside the user's ear, the "outside-the-ear microphone" 330 may alternatively be located close to the user's mouth (for example in the headset wire). Although FIGS. 3 and 4 show the microphones right in the earpiece just outside the ear, this placement may be convenient but not always optimal quality-wise as there is a longer distance from the mouth of the user compared to a close-miked configuration (for example, mic at the end of a boom or in the headset wire).

Each of the headsets 340 may be comprised of at least one microphone, such as the in-ear microphone (340). The headsets 320 may form a connection to other headsets, for example, via mobile phones (and associated networks). The headsets 320 may include at least one processor, at least one memory storage device and an energy storage and/or energy source. The headsets 320 may include machine readable instructions, for example, instructions for implementing a deep learning process.

A combination of device (for example, headset 320-L and 320-R, including in-ear microphones 340 and outside-the-ear microphones 330) and machine readable instructions (for example, software) may be used to perform speech capture that provides accurate and real-time speech signal modeling and enhancement in order to achieve natural speech recording and transfer by deep learning and deep generative modeling using at least an in-ear microphone signal.

According to an example embodiment, deep learning based training headset 320 may include at least one in-ear microphone 340 and one outside-the-ear microphone 330. Deep learning based training headset 320 may process instructions to adjust audio for different conditions (for example, background noise conditions: type of noise (babble noise, traffic noise, music), and noise level, etc.), different people (for example, aural characteristics of voices including pitch, volume, resonance, etc.) and different types of sounds (for example, languages, singing, etc.).

According to an example scenario, the deep learning based training headset 320 may be used in a quiet location. In this scenario, the deep learning based training headset 320 may be trained for a plugged or, alternatively, an open headset. A plugged earbud or earplug completely seals the ear canal. An open headset does not seal the ear canal completely and may let in background noise to a (for example, much) greater extent than a plugged headset. The deep learning based training headset 320 may be trained for instances in which there may be sound from in-ear-speaker or, alternatively, no sound from in-ear-speaker. According to another example scenario, the deep learning based training headset 320 may be trained for a noisy environment.

FIG. 4 illustrates an example embodiment 400 of a head with a sound source 410 in person's mouth 405. The in-ear microphone 340 of the device captures sound in cavity C 420. The sound 410 from person's mouth 405 has at least two paths to in-ear microphone 340: the main path 430 (especially in the case of plugged headset) is through tissues 440 in-the-head and the cavity C 420, the second path 450 is outside of the head. The sound source 410 and the path 430 through the head may change during speech as the geometry of the speech organs change for different sounds.

Example embodiments may allow in-ear capture of person's own voice. The quality of in-ear recording of user's own voice using, for example, closed or almost closed headset, may be poor because of low pass filtering effect of the ear channel. The main resonance (quarter of the wavelength for open ear and half of the wavelength for blocked ear channel) may be approximately 2-3 kHz (open) or 4-6 kHz (blocked). The response in-ear canal depends on the content of the speech, for example, different vowels and consonants correspond to different geometry of the mouth, which affects the response function.

Figure 5:
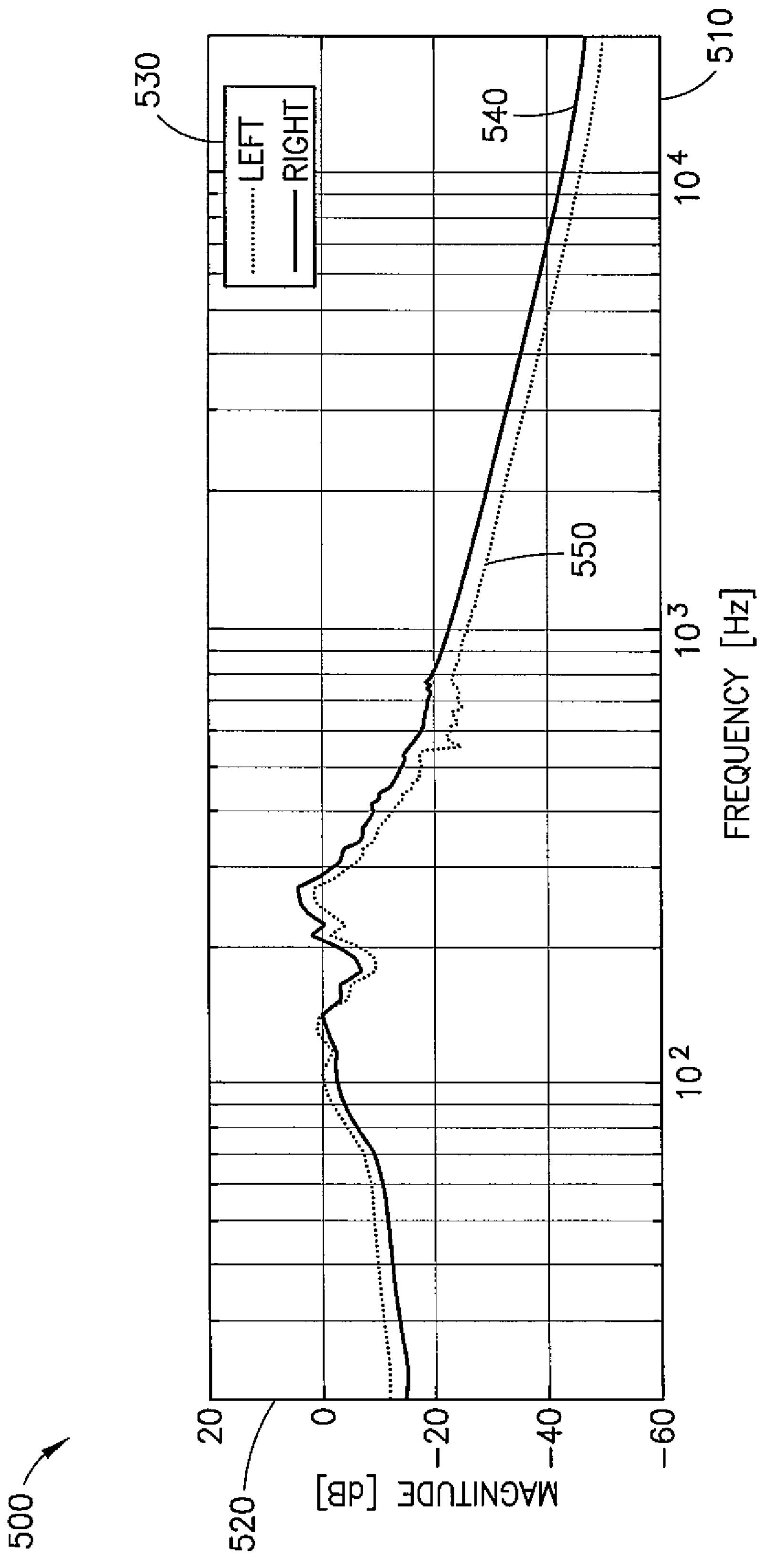
FIG. 5 illustrates an example embodiment of a transfer function from outside-the-ear mic to in-ear mic.

FIG. 5 illustrates an example embodiment 500 of a transfer function from outside-the-ear microphone to in-ear microphone.

As shown in FIG. 5, a transfer function for the right 540 and left 550 signals (shown in key 530) with a corresponding frequency 510 on the horizontal axis and a magnitude (in decibels) 520 on the vertical axis. Left 550 corresponds to the magnitude of the transfer function from the left outside-the-ear microphone to the left in-ear microphone and "right" 540 similarly for the right side. The example embodiments described herein may make the signal of the in-ear microphone correspond to the signal from the outside-the-ear microphone.

According to an example embodiment, the systems may recognize the sound signal coming from person's own mouth using in-ear microphone of the headphone and deep learning algorithm.

Figure 6:
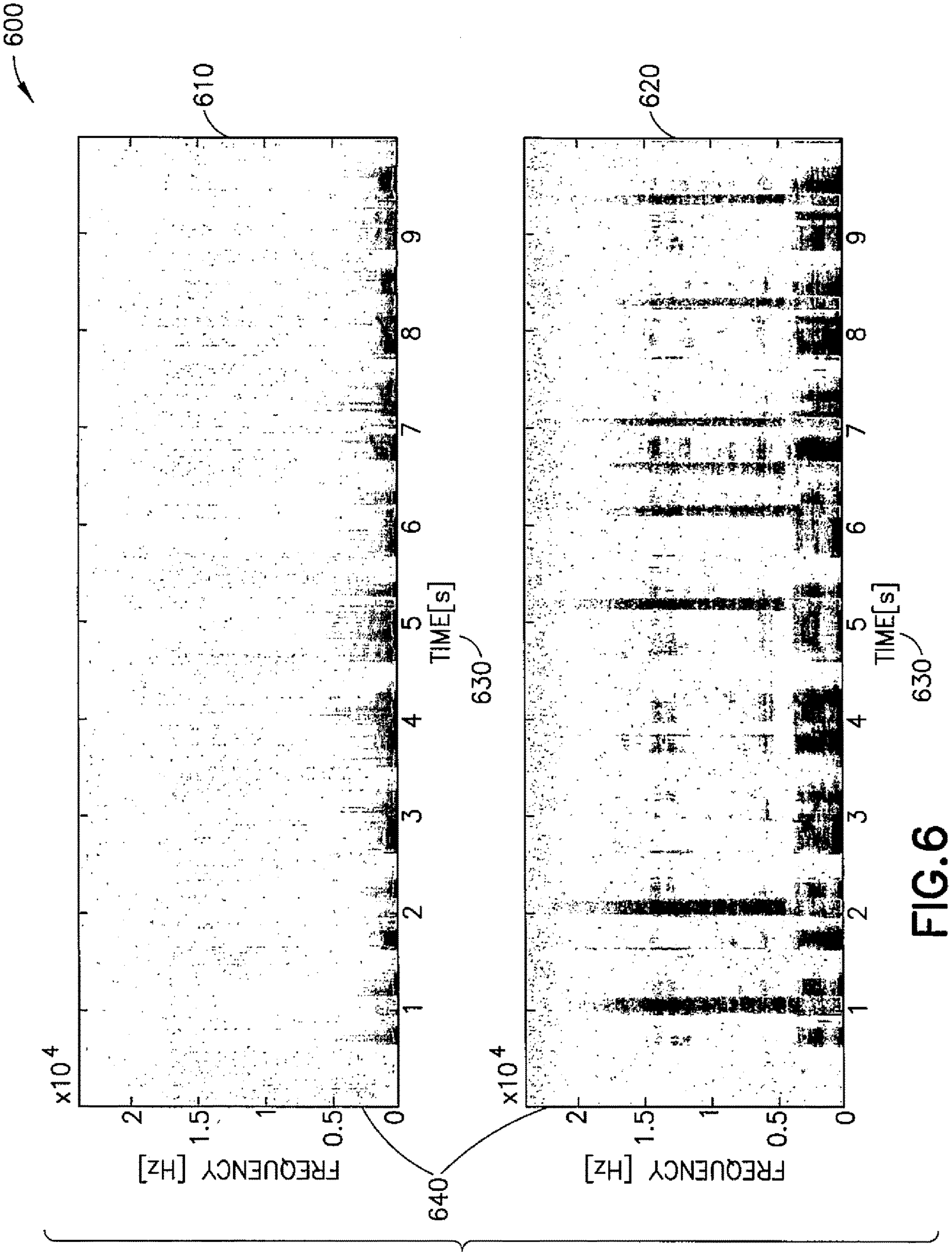
FIG. 6 illustrates an example embodiment of a measured spectrogram of speech in in-ear microphone (top) and outside-the-ear microphone (bottom)

FIG. 6 illustrates an example embodiment of a measured spectrogram of speech in an in-ear microphone (top) 610 and an outside-the-ear microphone (bottom) 620.

As shown in FIG. 6, a measured spectrogram may be determined for in-ear microphone (top) 610 and for outside-the-ear microphone (bottom) 620. The spectrograms provide a measure of frequency 640 (vertical axis) over time 630 (horizontal axis). The spectrograms 610 and 620 illustrates the effect of transmission through a main path 430 of tissues 440 in the head, as shown for example in FIG. 4, with respect to in-ear microphone 610 or, in the instance of spectrogram 620, via an open air path 450 outside of the head, as slow shown with respect to FIG. 4. The spectrogram for the in-ear microphone 610 may show noisy speech as the low pass filtering effect of the ear channel.

In instances in which the example embodiments are applied, and the in-ear microphone signal is the input (to the neural network) 610, the output signal may have a spectrogram similar to the outside-the-ear microphone 620.

Figure 7:
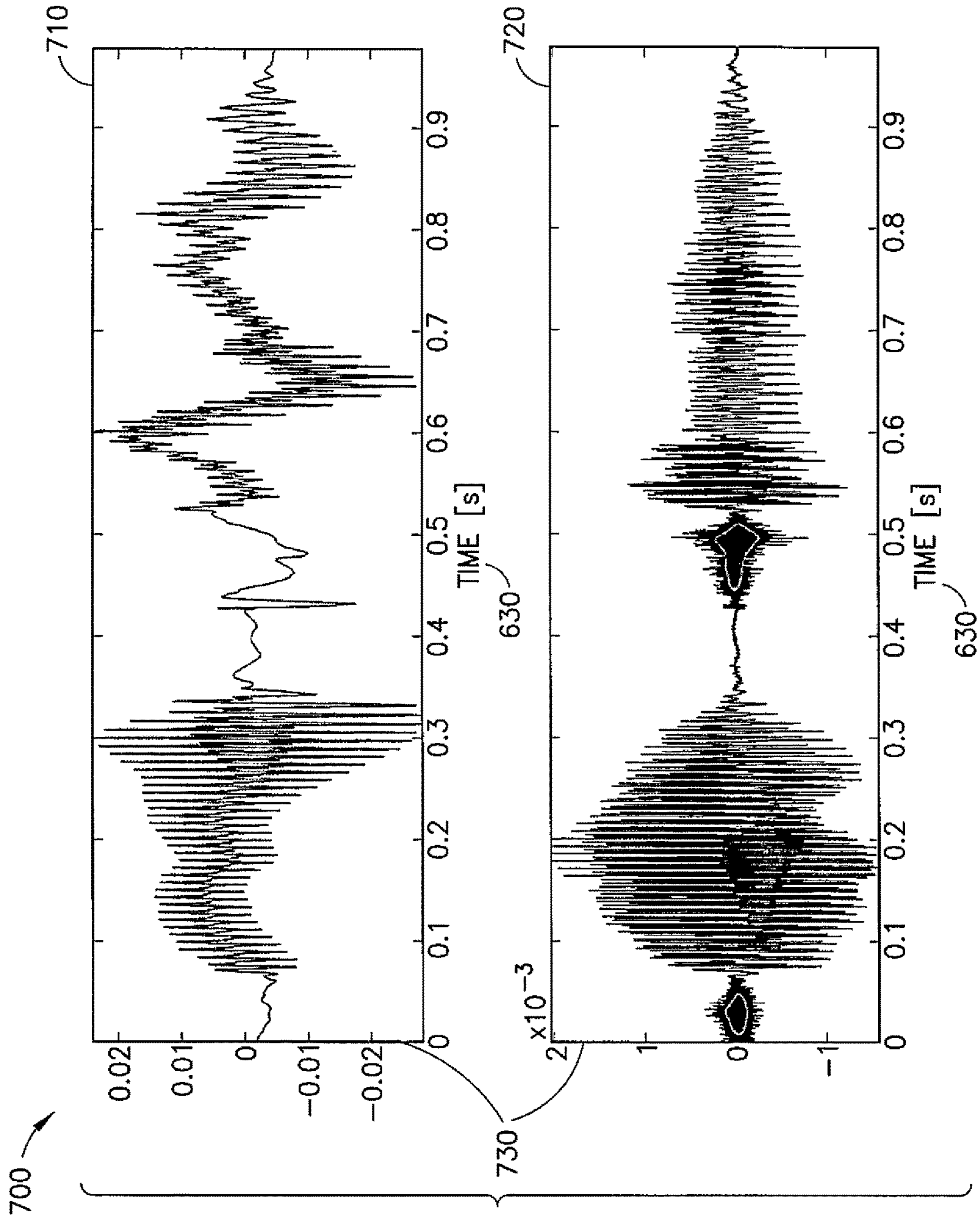
FIG. 7 illustrates example embodiments of a sound signal in an in-ear microphone and an outside-the-ear microphone.

FIG. 7 illustrates an example embodiment 700 of a sound signal in left in-ear microphone 710 (top) and in left outside-the-ear microphone 720 (bottom). The sound signal represents the word "seitseman". The phone, "t" can be seen at time, t=0.43 s, as a peak on top figure (in-ear microphone) and may be heard as a snap.

Figure 8:
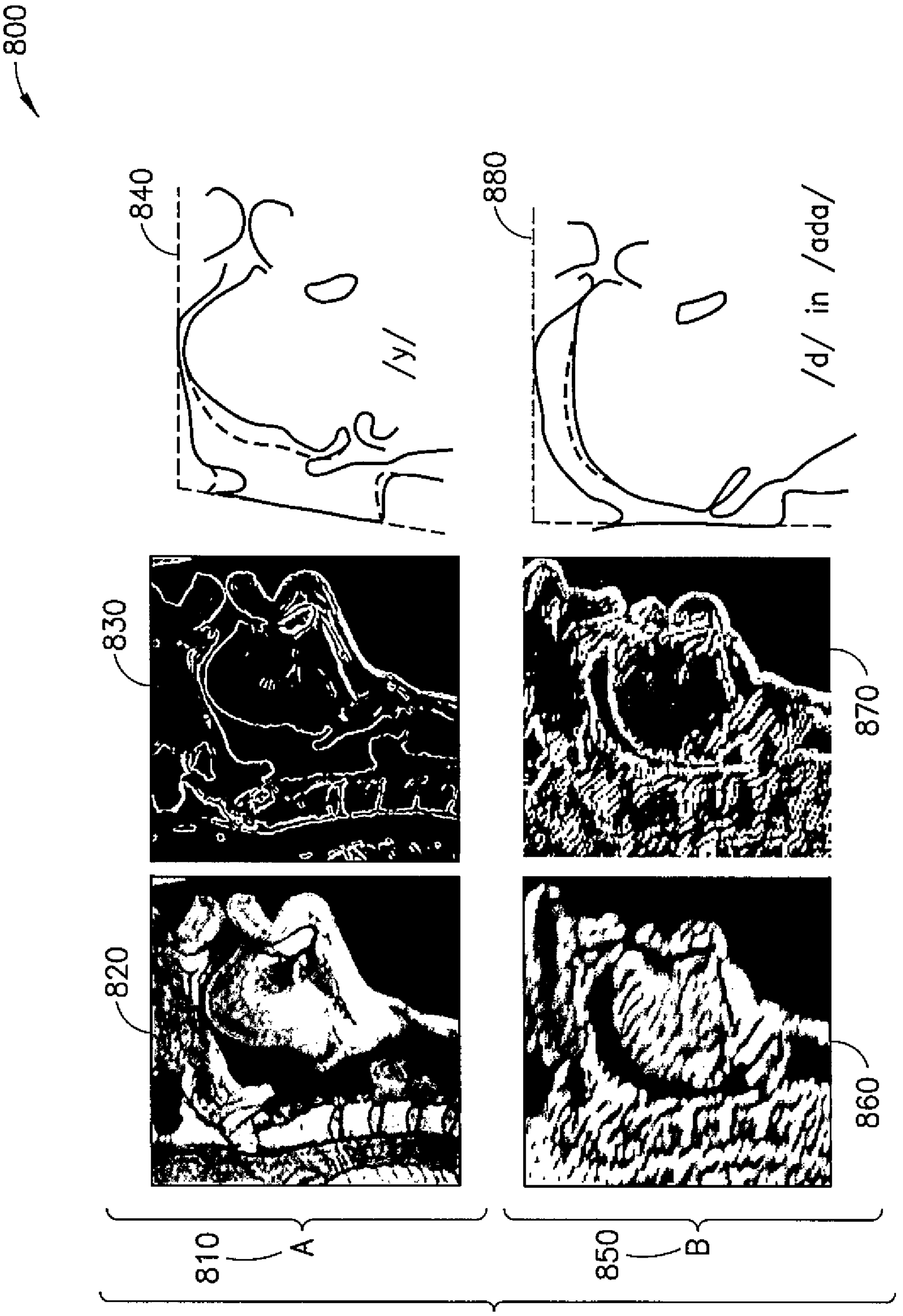
FIG. 8 illustrates an example embodiment of magnetic resonance imaging (MRI) images of speech organs.

FIG. 8 illustrates example embodiments 800 of magnetic resonance imaging (MRI) images of speech organs.

As shown in FIG. 8, by way of illustration, 810 A: provides an original midsagittal image of the vocal tract for the vowel /y/ from the volumetric MRI corpus (left, 820), the same image with enhanced edges (middle, 830), and the traced contours (right, 840). By way of illustration, 850 B, similarly as shown for 810 A, provides an original midsagittal image of the vocal tract for the real-time MRI corpus (from the volumetric MRI corpus (left, 860), the same image with enhanced edges (middle, 870), and the traced contours (right, 880)) showing the consonant /d/ in /a/-context (for example, within the sound "ada"). This information may be, for example, used as an input to model consonant-vowel articulation in speech patterns.

FIG. 8 illustrates how the vocal tract has a different configuration during different phonemes and therefore the transfer function of sound through the tissue to the in-ear canal varies also constantly based on the phoneme.

Figure 9:
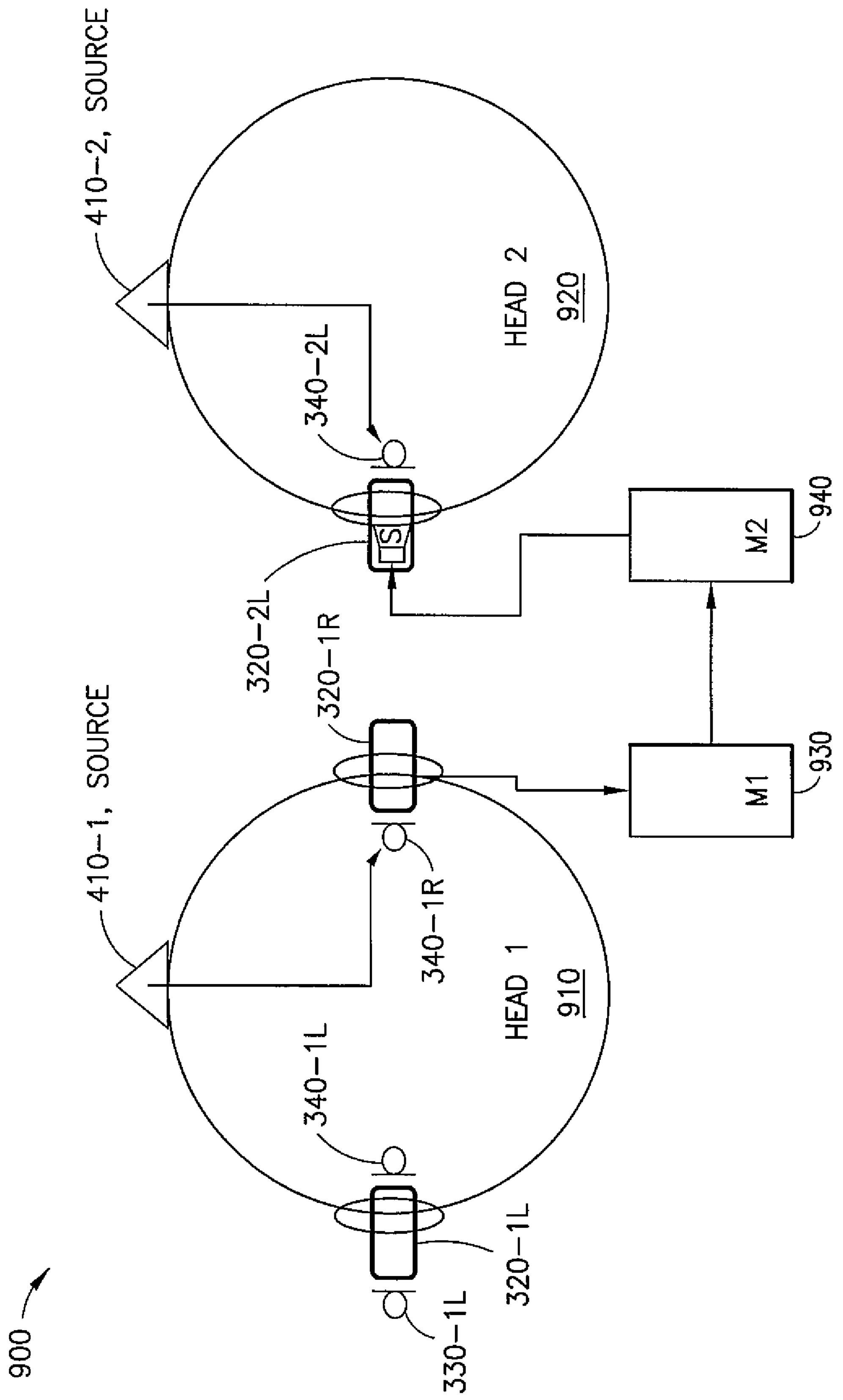
FIG. 9 illustrates an example embodiment of one or more people to communicating in a noisy environment.

FIG. 9 illustrates a scenario 900 in which one or more people (in this instance, two people represented by head 1 910, with headset 320-1, and corresponding outside-the-ear microphones 330-1 (for example, 330-1L and 330-1R, for left and right outside ear microphones) and in-ear microphones 340-1 (for example, 340-1L and 340-1R, for left and right in-ear microphones) and head 2 920 with headset 320-2 and corresponding in-ear microphones 340-2L) are attempting to communicate in a noisy location.

Communication in a noisy location may be enabled by in-ear voice capture of each person's own talk. As a first person (head 1 910) talks (for example, speaks) into the in-ear microphone 340-1R, the in-ear microphone 340-1R may capture aspects of the sound source 410-1 (for example, time, frequency, pressure, etc.). Sound waves may be represented using complex exponentials. An associated processor may implement the deep learning based model to clean the signal to approximate natural speech. The signal may be transported to the headset of person 2 (head 2, 920) (for example, via mobile phones, M1 930 and M2 940). Similarly, the same system may be applied in the headset of person 2 (head 2, 920) for sound source 410-2.

This system may be implemented in use cases, such as communication in a noisy situation in-ear recording of the first user's voice transferred to other people's headphones, where the received signal is played and the voice of the second user (the listener of the first user) may be reduced.

Figure 10:
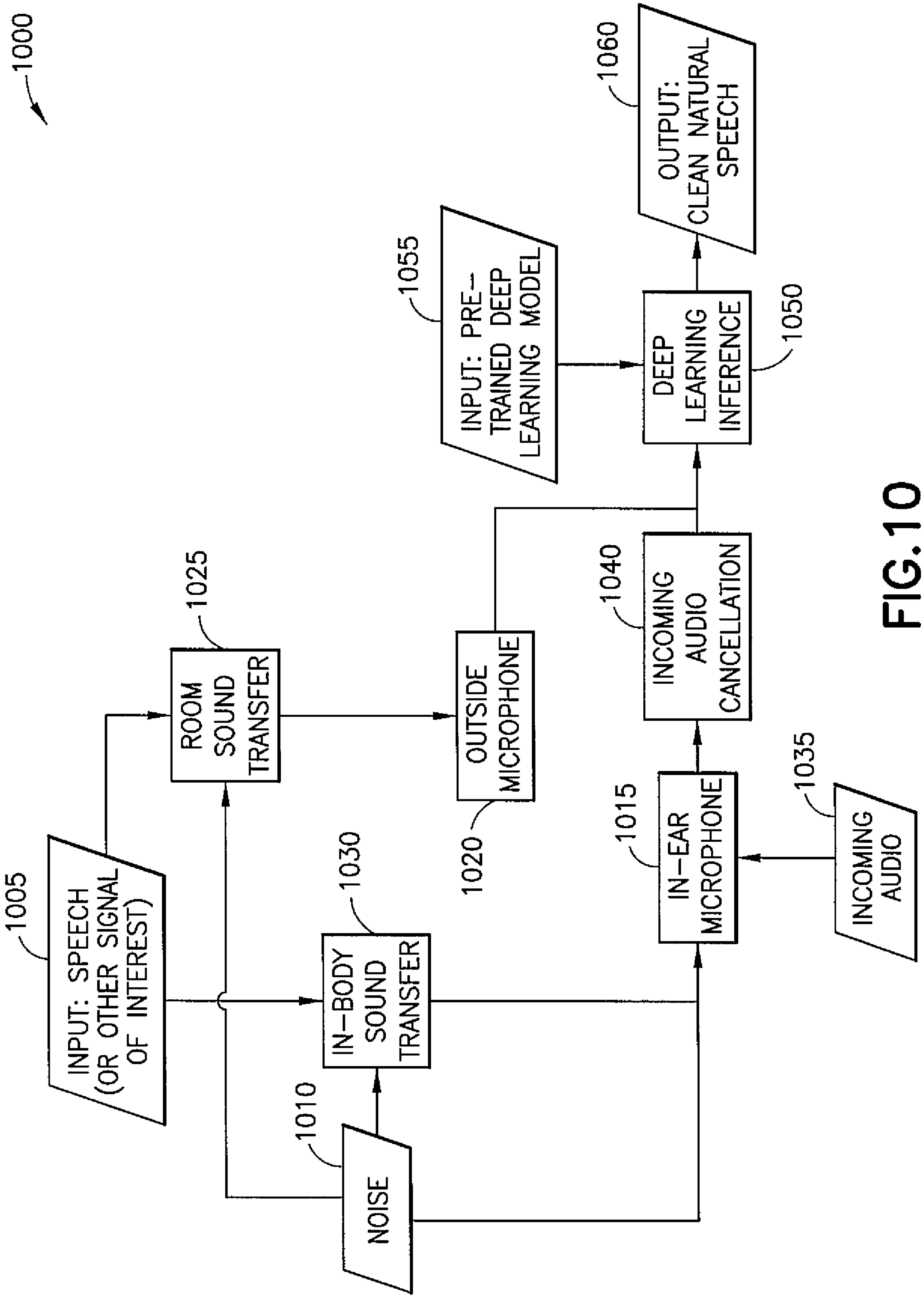
FIG. 10 illustrates an example embodiment of a flow chart of a process at an inference phase.

FIG. 10 illustrates an example embodiment of a system 1000 at an inference phase that may be implemented to perform speech capture that provides accurate and real-time speech signal modeling and enhancement in order to achieve natural speech recording and transfer by deep learning and deep generative modeling using at least an in-ear microphone signal.

When trained, for example using example embodiments such as described herein below with respect to FIGS. 11 and 12, the system 1000 may use a single microphone implementation, in which the in-ear microphone is used.

The system 1000 may take several inputs, such as a) noisy speech signal (or other signal of interest) through outside-the-ear microphone 1005, b) noisy speech through in-ear microphone 1010, c) incoming audio 1035 through in-ear microphone and d) pre-trained deep learning model 1055.

With regard to FIG. 10, the system 1000 is configured to determine the user's own voice in a noisy environment. The user may have a headset(s) 320 with an outside-the-ear microphone 1020 (for example, outside (or external) microphone 330) and internal microphones 1015 (for example, in-ear microphone 340) as well as a loudspeaker. The sound source may be the user's mouth, from which the sound transfers both outside the body in a room (room sound transfer 1025) to external microphone and inside the body (in body sound transfer 1030), where the internal microphone captures the sound signal. In both cases noise may affect the signal. Deep learning inference 1050 may receive signals from external microphone 1020 and in-ear microphone 1015 (for example, after incoming audio 1040 cancellation may be applied to the output of the in-ear microphone 1015). Deep learning inference 1050 may use one or more pre-trained deep learning models to process clean (or, for example, noise-free) natural sound (for example, speech) 1060.

Figure 11:
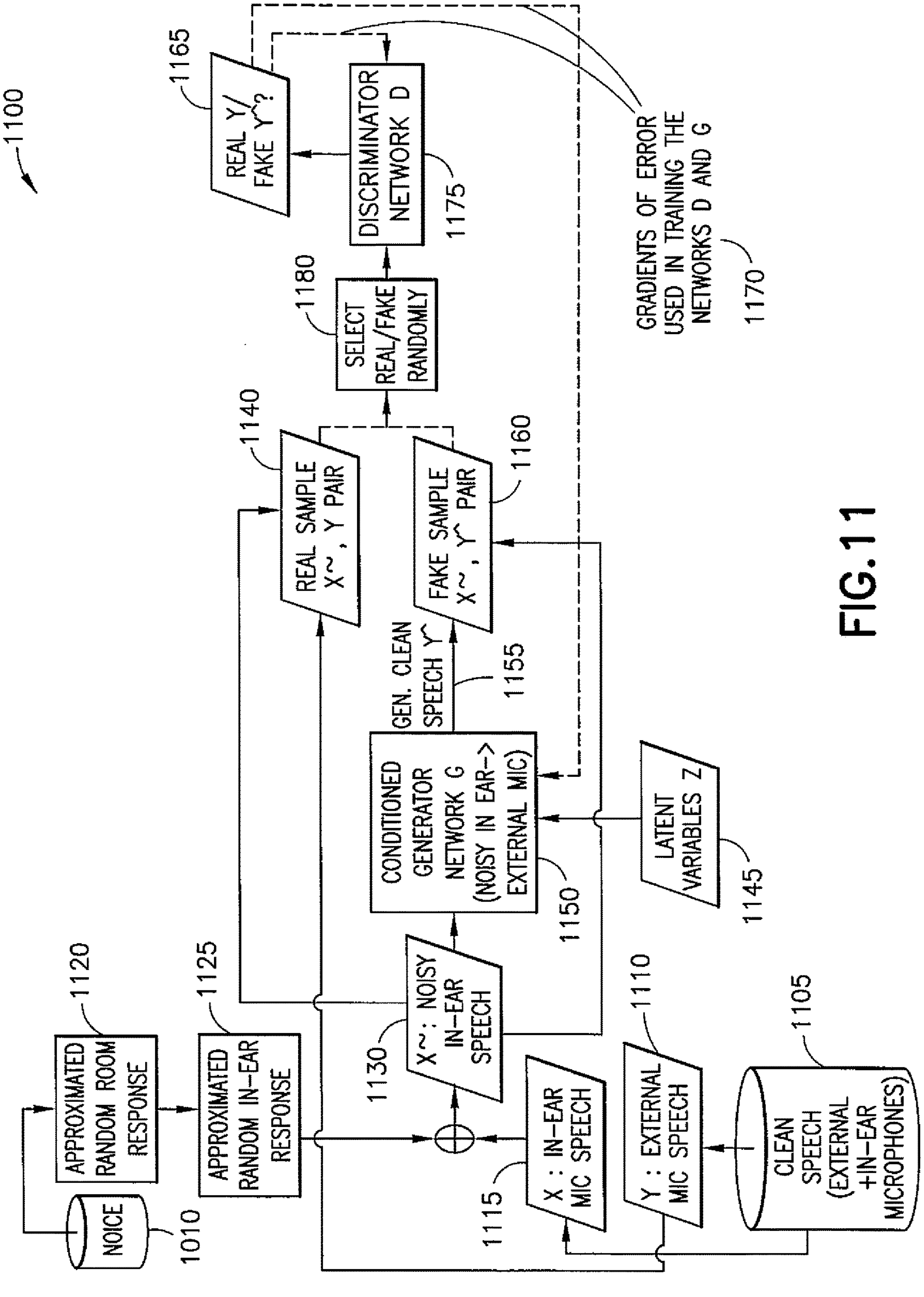
FIG. 11 illustrates an example embodiment of a flow chart of a process of learning dynamic transfer functions from in-ear microphone speech to external microphone speech.
Figure 12:
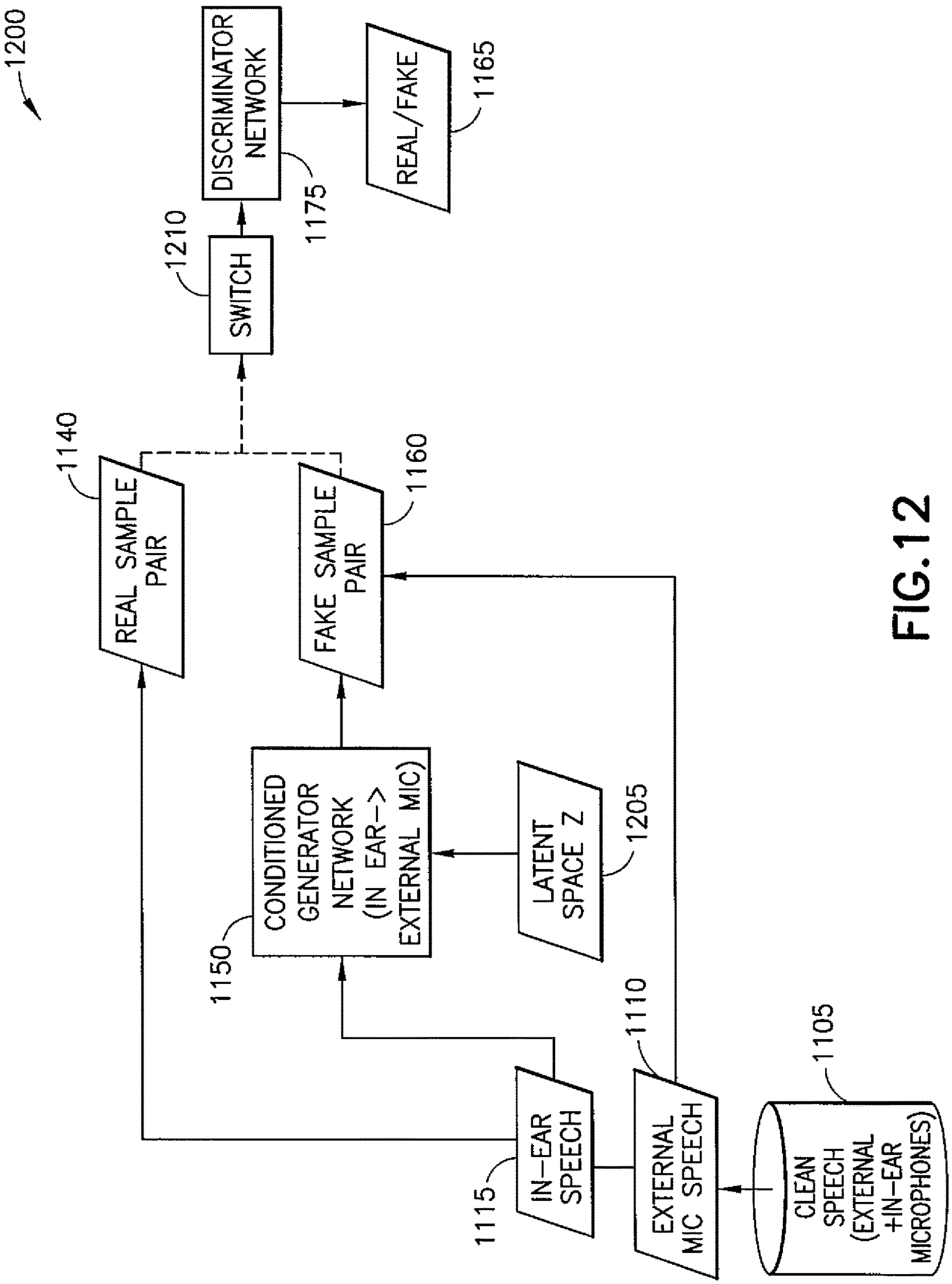
FIG. 12 illustrates another example embodiment of a flow chart of a process of learning dynamic transfer functions from external microphone speech to in-ear microphone speech.

Deep learning inference 1050 may implement different methods for training the deep learning model, such as shown in FIGS. 11 and 12, herein below. According to an example embodiment, deep learning inference 1050 (or an associated device or machine readable instructions, etc.) may train with real recorded signals from inner and outer microphones and semi-synthetic noise in in-ear signal. During actual usage, only the network G may be used, and that takes as input the microphone signals and outputs the clean signal. Network G may include a learning network, a generative network, etc.

FIG. 11 illustrates an example embodiment 1100 of learning dynamic transfer functions from in-ear microphone speech to external microphone speech. These functions may then be utilized to run inference from noisy in-ear recordings to clean speech.

In this example embodiment, the deep learning model may be trained using recorded, synchronized noiseless (clean) speech signals 1105 from both the in-ear 1015 (X: in-ear microphone speech 1115) and the outside-the-ear (for example, external) microphones 1020 (Y: external microphone speech 1110). Deep learning inference 1050 may train a deep learning system in which the input X~ is the noisy speech signal 1130 from in-ear microphone, and output Y^ is the most probable clean speech signal 1155 that would have produced the observed in-ear signal X 1115. Deep learning inference 1050 may generate input X~, the noisy speech signal 1130, based on combining in-ear microphone speech 1115 and approximated random in-ear response 1125 (which may be determined from a data store noise 1010 that includes an approximated random room response.

Deep learning inference 1050 may augment the clean speech signal X 1115 with a parametrized noise database 1010, but keep the target Y noiseless so that the network learns to produce the most likely consistent Y^ from the input X. This may include selection at random (select/real/fake randomly) 1180 between a real sample X~, Y pair 1140 and a fake sample pair X~, Y^, 1160, which may have been determined by conditioned generator neural network G 1150. A real sample pair may be defined as a pair of signals, the noisy in-ear speech X~ and the external mic speech Y, which are actually recorded using the microphones and not "fake" samples generated using the conditioned generator neural network G. Generator network G 1150 may receive latent variables z 1145 and gradients of error for training networks D and G, which may be determined by discriminator network D 1175. Generator network G 1150 may generate a clean speech signal Y^ 1155. Thereafter, clean speech signal Y^ 1155 may be paired with X~, the noisy speech signal 1130 to create the fake sample X~, Y^ pair 1160.

The (for example, conditioned) generator network G 1150 may be trained simultaneously with a discriminator network D 1175 as shown in FIG. 11. Discriminator network D 1175 may receive either real Y/fake Y^ 1165 selected randomly 1180 and thereafter determine gradients of error that may be used in training the networks D and G 1170. The error may be computed from the difference between the discriminator output and the known ground truth value (real or fake). Many error functions, such as the binary cross-entropy may be used as the definition of the error. The error function may be differentiated with regards of the weights of the networks G and D using back propagation. The resulting gradients for this sample (or set of samples) may be called "gradients of error".

These gradients of error 1170 may be input to the generator network G 1150 and used in training the generator network G 1150 to generate an external microphone signal from an in-ear microphone signal (for example, clean speech signal 1155) based on the at least one real in-ear microphone audible signal and the at least one real external microphone audible signal. Deep learning inference 1050 may utilize any variant of Generative Adversarial Network (GAN), including Deep Regret Analytic Generative Adversarial Network (DRAGAN), Wasserstein Generative Adversarial Network (WGAN) or Progressive Growing of GANs, etc. Although FIG. 11 illustrates a GAN training, deep learning inference 1050 may utilize any conditional generative modelling, including autoencoders and autoregressive models (such as, for example, Wavenet).

The input to the network may be raw signal, or any kind of time-spectrum representation, such as short-term Fourier transforms (STFTs).

According to an example embodiment, deep learning inference 1050 may train to adaptively utilize both inner and outer microphones. This example embodiment may extend the example embodiment presented above in FIG. 11 by adding the noise in both in-ear signal X and external signal Y. This may allow the network to learn to adaptively utilize both in-ear and external signal during the inference phase. The deep learning inference 1050 may process the signals to approximate a transfer from instances of signals received from outside-the-ear microphone to in-ear microphone, for example as shown in FIGS. 5-8. FIGS. 5-8 provide non-limiting clarifying examples of the results of the transform based on example embodiments described herein. The deep learning network may determine non-linear mapping between the signals, and the result may depend on the training data and the training procedure.

The external microphone signal may be (for example, selected, assessed, as) a good signal in instances in which there is very little noise. On the other hand, if the environment is extremely noisy, the internal microphone (with the approximated transfer function in-ear→external) may need (for example, provides a better approximation of clean speech) to be used. In many instances, the optimal result may be achieved using both signals. The example embodiments provide a method of using a neural network to adaptively utilize both signals in approximately optimal way. Note that during training the inputs to network G are noisy in-ear microphone signal X~, noisy external microphone signal Y~ and the output is the prediction of the most probable consistent clean external signal Y^ 1155.

The training may be implemented in a quiet environment with both mic signals (in-ear microphone and outside the ear microphone). The example embodiments may detect the noise level, and decide when to start recording data for the personalized training.

FIG. 11 describes the training of the Generative Adversarial Network (GAN). The outputs of the network are G: the generated audio (1160), D: whether the sample is real or generated (1165). D is only used during training. The output of the whole process is the trained neural network G (1150). The network D may be trained to target one or multiple microphone signals (for example, FIG. 11 uses two microphone signals), but the training procedure may be slightly changed based on the target mic configuration. Y (the external microphone data set) may contain multiple microphones and X (the in-ear microphone data set) may contain multiple microphones.

During training, both microphone signals may be required. In some instances a domain transfer training is possible without simultaneous microphone recordings (for example, in a manner similar to cycle Generative Adversarial Network (CycleGAN)), but the generator quality may be worse than that generated from both microphone signals.

FIG. 12 illustrates an example embodiment 1200 of learning dynamic transfer functions from external microphone speech to in-ear microphone speech. These functions may then be utilized to build a (for example, huge) virtual training set from just external microphone recordings.

As shown in the example embodiment, a system or device, for example deep learning inference 1050 may learn inverse time-dynamic transfer functions and generate large training sets from normal speech data. Deep learning inference 1050 may receive recorded, synchronized noiseless (clean) speech signals 1105 from both the in-ear 1015 (X: in-ear microphone speech 1115) and the outside (for example, external) microphones 1020 (Y: external microphone speech 1110). Generator network G 1150 may receive latent space z (for example, latent variables) 1205 and output fake sample pair 1160. A switch 1210 may receive real sample pair 1140 and fake sample pair 1160 and output to discriminator network 1175, which may determine a real/fake output 1165. The discriminator network may learn to distinguish between generated signals from generator network and real signals.

Deep learning training may require (for example, utilize) large representative databases in order to properly implement the deep learning process. The example embodiments may generate training data for a system, such as the one presented in FIG. 12.

FIGS. 11 and 12 show the training process of the generative network. The output of the actual system as it is used in practice (for example, during a VoIP call), is the noise-free (for example, clean) speech as shown in FIG. 10.

Figure 13:
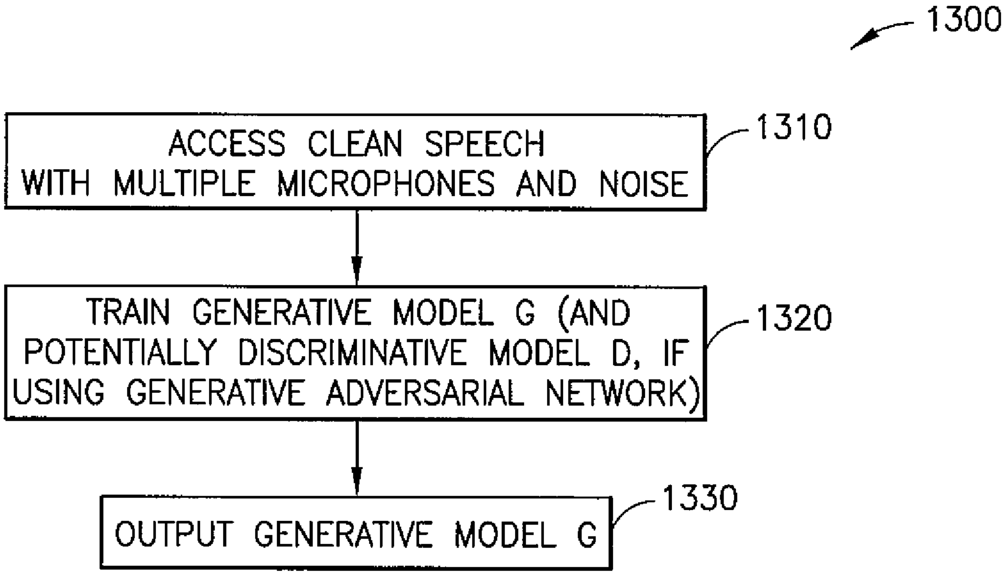
FIG. 13 shows a method in accordance with example embodiments which may be performed by an apparatus.

FIG. 13 is an example flow diagram 1300 illustrating a method in accordance with example embodiments which may be performed by an apparatus.

At block 1310, a device, for example UE 110 or other device in network 100, may access a clean speech signal(s) with multiple microphones and noise. The microphones may include external microphones and in-ear-microphones.

At block 1320, UE 110 may train generative model G (and potentially discriminative model D, if using generative adversarial network).

At block 1330, UE 110 may output generative model G. Generative model G may include a conditioned generative network, such as described with respect to FIGS. 11 and 12.

Figure 14:
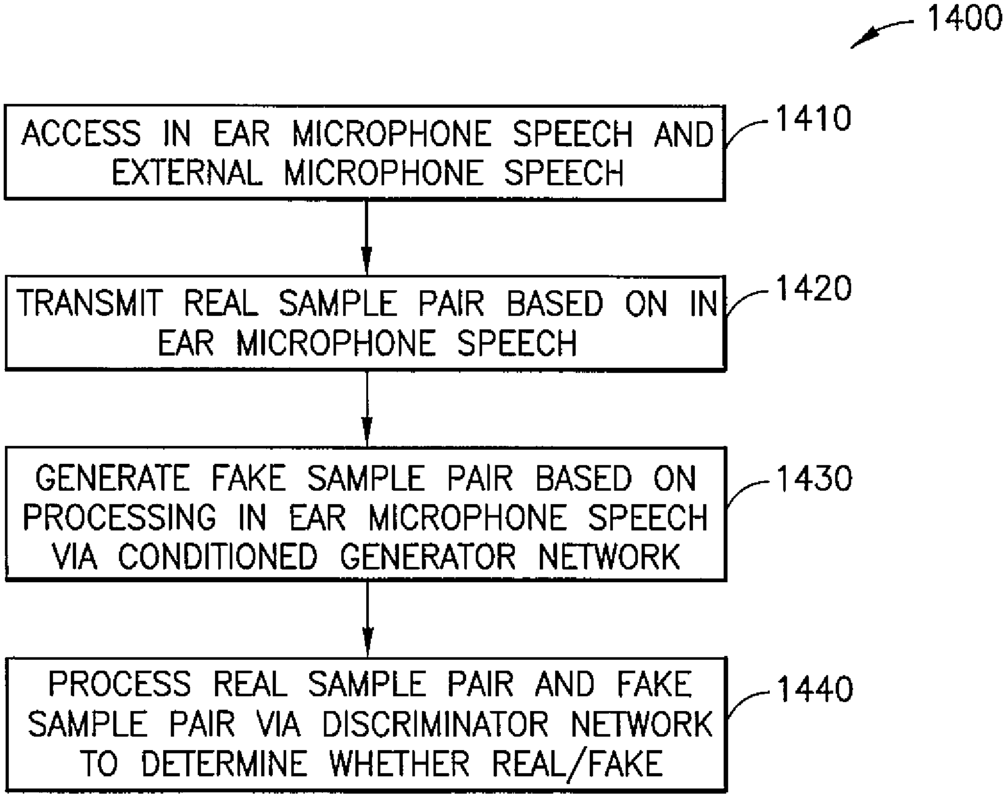
FIG. 14 shows a method in accordance with example embodiments which may be performed by an apparatus.

FIG. 14 is an example flow diagram 1400 illustrating a method in accordance with example embodiments which may be performed by an apparatus. FIG. 14 may describe the training of the generative network at a high level.

At block 1410, a device, for example UE 110, may receive (or access, etc.) in-ear microphone speech 1115 and external microphone speech 1110, for example, from a database of clean speech 1105. The speech signals may comprise synchronized noiseless (clean) speech signals from both the in-ear and the external microphone. For example, UE 110 may access corresponding samples of in-ear microphone speech and external (for example, outside-the-ear) microphone speech, which may be hey paired in this instance.

At block 1420, UE 110 may transmit (and/or determine) a real sample pair 1140 based on the in-ear microphone speech 1115.

At block 1430, UE 110 may process the in-ear microphone speech via a conditioned generator network to determine a fake sample pair.

At block 1440, UE 110 may process the real sample pair and the fake sample pair via discriminator network to determine a real/fake speech, for example, via a discriminator network. D network may be used for training (to get the gradients of error for training the G network). The gradient in this instance is a multi-variable generalization of the derivative.

Figure 15:
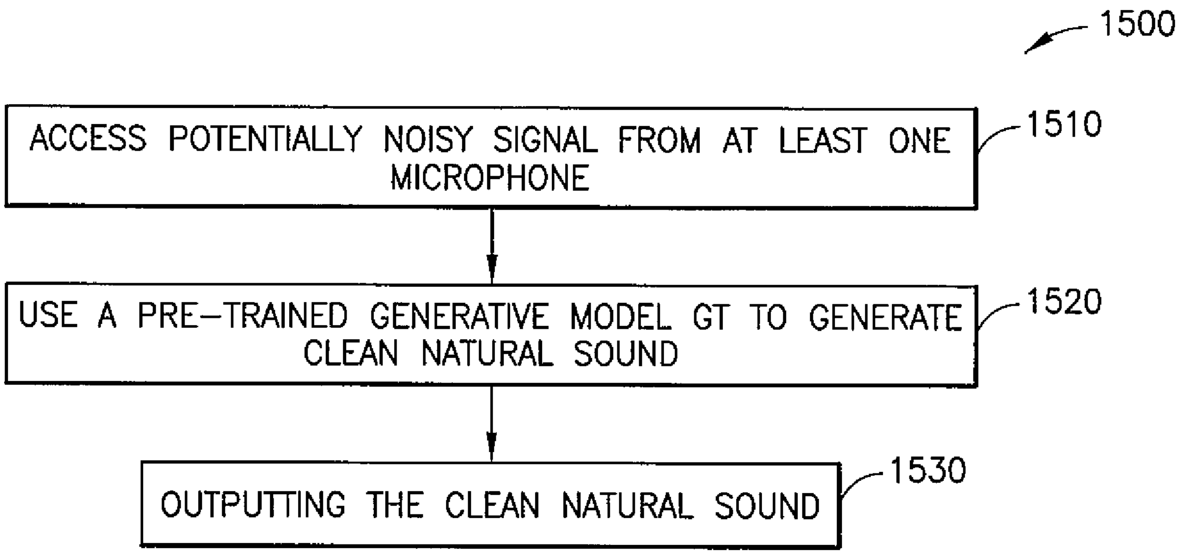
FIG. 15 shows a method in accordance with example embodiments which may be performed by an apparatus.

FIG. 15 is an example flow diagram 1500 illustrating a method in accordance with example embodiments which may be performed by an apparatus.

At block 1510, a device, for example UE 110, may access potentially noisy signal from at least one microphone.

At block 1520, UE 110 may use a pre-trained generative model GT to generate clean natural sound.

At block 1530, UE 110 may output the clean natural sound.

Figure 16:
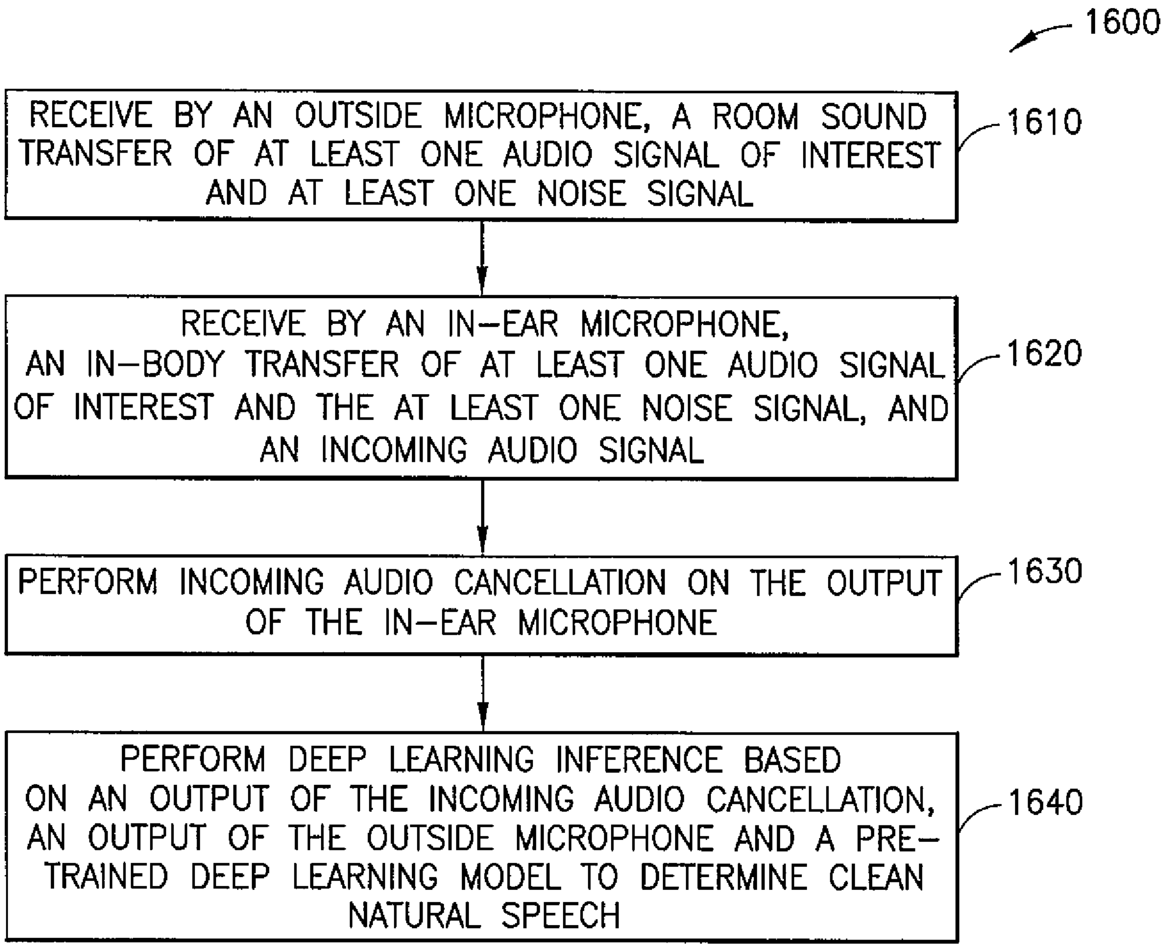
FIG. 16 shows a method in accordance with example embodiments which may be performed by an apparatus.

FIG. 16 is an example flow diagram 1600 illustrating a method in accordance with example embodiments which may be performed by an apparatus.

At block 1610, a device, for example UE 110, may receive at least one of a noisy speech (or other audio) signal through an outside-the-ear microphone, a noisy speech (or other audio) signal through an in-ear microphone, incoming audio through an in-ear microphone and a pre-trained deep learning model. The UE may require at least one input plus pre-trained model.

At block 1420, UE 110 may perform an in-body sound transfer of the speech (or other signal of interest) and noise to an in-ear microphone. The in-ear microphone may also receive incoming audio.

At block 1430, incoming audio cancellation may be performed on the output of the in-ear microphone.

At block 1440, UE 110 may perform a room sound transfer of the speech (or other signal of interest) and noise to an outside-the-ear microphone.

At block 1450, UE 110 may perform deep learning inference on the outputs of the incoming audio cancellation and the outside-the-ear microphone to determine and output clean natural speech.

Without in any way limiting the scope, interpretation, or application of the claims appearing below, a technical effect of one or more of the example embodiments disclosed herein is to enable a speech capture solution that provides accurate and real-time speech signal modeling and enhancement in order to achieve natural speech recording and transfer by deep learning and deep generative modeling using at least an in-ear microphone signal.

An example embodiment may provide a method comprising accessing, by at least one processing device, a real noise-free audible signal including at least one real in-ear microphone audible signal and at least one real external microphone audible signal and at least one noise signal, training a generative network to generate an external microphone signal from an in-ear microphone signal based on the at least one real in-ear microphone audible signal and the at least one real external microphone audible signal; and outputting the generative network.

In accordance with an example embodiment as described in paragraphs above, accessing, by at least one processing device, at least one in-ear microphone speech signal and at least one external microphone speech signal; transmitting at least one real sample pair based on the at least one in-ear microphone speech signal; generating at least one fake pair based on processing the at least one in-ear microphone speech signal via a conditioned generator network; and processing the at least one real sample pair and the at least one fake sample pair via a discriminator network to determine whether real/fake.

In accordance with an example embodiment as described in paragraphs above, wherein the at least one processing device is part of a wearable microphone apparatus.

In accordance with an example embodiment as described in paragraphs above, wherein the wearable microphone system further comprises one of more of: at least one in-ear microphone; at least one in-ear speaker; a connection to at least one other wearable microphone system; at least one processor; and at least one memory storage device.

In accordance with an example embodiment as described in paragraphs above, wherein the at least one processing device further comprises: at least one in-ear microphone and at least one outside-the-ear microphone.

In accordance with an example embodiment as described in paragraphs above, wherein the at least one external microphone speech sample and the at least one external microphone speech sample are selected to include at least one of: different people; different types of sounds; a quiet environment including a plugged or an open headset; a quiet environment including sound from an in-ear speaker and no sound from an in-ear speaker; and a noisy environment.

In accordance with an example embodiment as described in paragraphs above, wherein where an input X~ of the at least one processing device is a noisy speech signal from the at least one in-ear microphone, and an output Y^ is a most probable clean sound signal that would have produced an observed in-ear signal X.

In accordance with an example embodiment as described in paragraphs above, wherein the conditioned generator network comprises at least one of a generative adversarial network, a deep regret analytic generative adversarial network, a Wasserstein generative adversarial network and a progressive growing of generative adversarial networks.

In accordance with an example embodiment as described in paragraphs above, wherein the conditioned generator network comprises at least one of an auto-encoder and an autoregressive model.

An example embodiment may provide a method comprising receiving, by an outside-the-ear microphone, a room sound transfer of at least one audio signal of interest and at least one noise signal, receiving, by an in-ear microphone, an in-body transfer of at least one audio signal of interest and the at least one noise signal, and an incoming audio signal; performing incoming audio cancellation on an output of the in-ear microphone; and performing deep learning inference based on an output of the incoming audio cancellation, an output of the outside-the-ear microphone and a pre-trained deep learning model to determine a clean natural sound.

In accordance with an example embodiment as described in paragraphs above, transmitting the clean natural sound, wherein the clean natural sound is configured to be received and played by a second headphone.

In accordance with an example embodiment as described in paragraphs above, wherein the clean natural sound comprises human speech.

An example embodiment may be provided in an apparatus comprising at least one processor; and at least one non-transitory memory including computer program code, the at least one non-transitory memory and the computer program code may be configured to, with the at least one processor, cause the apparatus to: access at least one in-ear microphone speech signal and at least one external microphone speech signal; transmit at least one real sample pair based on the at least one in-ear microphone speech signal; generate at least one fake pair based on processing the at least one in-ear microphone speech signal via a conditioned generator network; and process the at least one real sample pair and the at least one fake sample pair via a discriminator network to determine whether real/fake.

In accordance with an example embodiment as described in paragraphs above, wherein the apparatus is part of a wearable microphone apparatus.

In accordance with an example embodiment as described in paragraphs above, wherein the wearable microphone system further comprises one of more of: at least one in-ear microphone; at least one in-ear speaker; a connection to at least one other wearable microphone system; at least one processor; and at least one memory storage device.

In accordance with an example embodiment as described in paragraphs above, wherein the apparatus further comprises: at least one in-ear microphone and at least one outside-the-ear microphone.

In accordance with an example embodiment as described in paragraphs above, wherein the at least one external microphone speech sample and the at least one external microphone speech sample are selected to include at least one of: different people; different types of sounds; a quiet environment including a plugged or an open headset; a quiet environment including sound from an in-ear speaker and no sound from an in-ear speaker; and a noisy environment.

In accordance with an example embodiment as described in paragraphs above, wherein an input X~ of the apparatus is a noisy speech signal from the at least one in-ear microphone, and an output Y^ is a most probable clean sound signal that would have produced an observed in-ear signal X.

An example embodiment may be provided in an apparatus comprising at least one processor; and at least one non-transitory memory including computer program code, the at least one non-transitory memory and the computer program code may be configured to, with the at least one processor, cause the apparatus to: access a real noise-free audible signal including at least one real in-ear microphone audible signal and at least one real external microphone audible signal and at least one noise signal, train a generative network to generate an external microphone signal from an in-ear microphone signal based on the at least one real in-ear microphone audible signal and the at least one real external microphone audible signal; and output the generative network.

In accordance with an example embodiment as described in paragraphs above, receive, by an outside-the-ear microphone, a room sound transfer of at least one audio signal of interest and at least one noise signal; receive, by an in-ear microphone, an in-body transfer of at least one audio signal of interest and the at least one noise signal, and an incoming audio signal; perform incoming audio cancellation on an output of the in-ear microphone; and perform deep learning inference based on an output of the incoming audio cancellation, an output of the outside-the-ear microphone and a pre-trained deep learning model to determine a clean natural sound.

In accordance with an example embodiment as described in paragraphs above, wherein the at least one non-transitory memory and the computer program code are further configured to, with the at least one processor, cause the apparatus to perform transmit the clean natural sound, wherein the clean natural sound is configured to be received and played by a second headphone.

In accordance with another example, an example apparatus comprises: means for accessing a real noise-free audible signal including at least one real in-ear microphone audible signal and at least one real external microphone audible signal and at least one noise signal, means for training a generative network to generate an external microphone signal from an in-ear microphone signal based on the at least one real in-ear microphone audible signal and the at least one real external microphone audible signal; and means for outputting the generative network.

In accordance with an example embodiment as described in paragraphs above, means for accessing, by at least one processing device, at least one in-ear microphone speech signal and at least one external microphone speech signal; means for transmitting at least one real sample pair based on the at least one in-ear microphone speech signal; means for generating at least one fake pair based on processing the at least one in-ear microphone speech signal via a conditioned generator network; and means for processing the at least one real sample pair and the at least one fake sample pair via a discriminator network to determine whether real/fake.

In accordance with an example embodiment as described in paragraphs above, wherein the apparatus is part of a wearable microphone apparatus.

In accordance with an example embodiment as described in paragraphs above, wherein the wearable microphone system further comprises one of more of: at least one in-ear microphone; at least one in-ear speaker; a connection to at least one other wearable microphone system; at least one processor; and at least one memory storage device.

In accordance with an example embodiment as described in paragraphs above, wherein the apparatus further comprises at least one in-ear microphone and at least one outside-the-ear microphone.

In accordance with an example embodiment as described in paragraphs above, wherein the at least one external microphone speech sample and the at least one external microphone speech sample are selected to include at least one of: different people; different types of sounds; a quiet environment including a plugged or an open headset; a quiet environment including sound from an in-ear speaker and no sound from an in-ear speaker; and a noisy environment.

In accordance with an example embodiment as described in paragraphs above, wherein where an input X~ of the at least one processing device is a noisy speech signal from the at least one in-ear microphone, and an output Y^ is a most probable clean sound signal that would have produced an observed in-ear signal X.

In accordance with an example embodiment as described in paragraphs above, wherein the conditioned generator network comprises at least one of a generative adversarial network, a deep regret analytic generative adversarial network, a Wasserstein generative adversarial network and a progressive growing of generative adversarial networks.

In accordance with another example, an example apparatus comprises: means for receiving, by an outside-the-ear microphone, a room sound transfer of at least one audio signal of interest and at least one noise signal; means for receiving, by an in-ear microphone, an in-body transfer of at least one audio signal of interest and the at least one noise signal, and an incoming audio signal; means for performing incoming audio cancellation on an output of the in-ear microphone; and means for performing deep learning inference based on an output of the incoming audio cancellation, an output of the outside-the-ear microphone and a pre-trained deep learning model to determine a noise-free natural sound.

An example apparatus may be provided in a non-transitory program storage device, such as memory 125 shown in FIG. 1 for example, readable by a machine, tangibly embodying a program of instructions executable by the machine for performing operations, the operations comprising accessing, by at least one processing device, at least one in-ear microphone speech signal and at least one external microphone speech signal; transmitting at least one real sample pair based on the at least one in-ear microphone speech signal; generating at least one fake pair based on processing the at least one in-ear microphone speech signal via a conditioned generator network; and processing the at least one real sample pair and the at least one fake sample pair via a discriminator network to determine whether real/fake.

An example apparatus may be provided in a non-transitory program storage device, such as memory 125 shown in FIG. 1 for example, readable by a machine, tangibly embodying a program of instructions executable by the machine for performing operations, the operations comprising receiving, by an outside-the-ear microphone, a room sound transfer of at least one audio signal of interest and at least one noise signal, receiving, by an in-ear microphone, an in-body transfer of at least one audio signal of interest and the at least one noise signal, and an incoming audio signal; performing incoming audio cancellation on an output of the in-ear microphone; and performing deep learning inference based on an output of the incoming audio cancellation, an output of the outside-the-ear microphone and a pre-trained deep learning model to determine a noise-free natural sound.

Embodiments herein may be implemented in software (executed by one or more processors), hardware (e.g., an application specific integrated circuit), or a combination of software and hardware. In an example embodiment, the software (e.g., application logic, an instruction set) is maintained on any one of various conventional computer-readable media. In the context of this document, a "computer-readable medium" may be any media or means that can contain, store, communicate, propagate or transport the instructions for use by or in connection with an instruction execution system, apparatus, or device, such as a computer, with one example of a computer described and depicted, e.g., in FIG. 1. A computer-readable medium may comprise a computer-readable storage medium (e.g., memories 125, 155, 171 or other device) that may be any media or means that can contain, store, and/or transport the instructions for use by or in connection with an instruction execution system, apparatus, or device, such as a computer. A computer-readable storage medium does not comprise propagating signals.

If desired, the different functions discussed herein may be performed in a different order and/or concurrently with each other. Furthermore, if desired, one or more of the above-described functions may be optional or may be combined.

Although various aspects are set out above, other aspects comprise other combinations of features from the described embodiments, and not solely the combinations described above.

It is also noted herein that while the above describes example embodiments, these descriptions should not be viewed in a limiting sense. Rather, there are several variations and modifications which may be made without departing from the scope of the present invention.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments, these descriptions should not be viewed in a limiting sense. Rather, there are several variations and modifications which may be made without departing from the scope of the present invention as defined in the appended claims.

In general, the various embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The foregoing description has provided by way of example and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method, comprising:

accessing, by at least one processing device, an audible signal including at least one in-ear microphone audible signal, at least one external microphone audible signal and at least one noise signal;

training a generative network to generate an enhanced external microphone signal from an accessed in-ear microphone signal based on the at least one in-ear microphone audible signal and the at least one external microphone audible signal; and outputting parameters for the generative network based on the training of the generative network.

2. The method of claim 1, wherein training the generative network further comprises:

providing at least one real sample pair based on the at least one in-ear microphone audible signal and the at least one external microphone audible signal;

determining a noisy in-ear audible signal based on the at least one in-ear microphone audible signal and the at least one noise signal;

generating a noise-free audible signal based on processing the noisy in-ear audible signal via the generative network;

providing at least one fake sample pair based on the generated noise-free audible signal and the noisy in-ear audible signal; and processing the at least one real sample pair and the at least one fake sample pair via a discriminator network to determine gradients of error to be used in training the generative network.

3. The method of claim 1, wherein the at least one processing device is part of a wearable microphone apparatus.

4. The method of claim 3, wherein the wearable microphone apparatus further comprises one or more of:

at least one in-ear microphone;

at least one in-ear speaker;

a connection to at least one other wearable microphone apparatus;

at least one processor; or at least one memory storage device.

5. The method of claim 1, wherein the at least one processing device further comprises:

at least one in-ear microphone and at least one outside-the-ear microphone.

6. The method of claim 1, wherein the at least one in-ear microphone audible signal and the at least one external microphone audible signal are selected to include at least one of:

different people;

different types of sounds;

a quiet environment including a plugged or an open headset;

a quiet environment including sound from an in-ear speaker and no sound from an in-ear speaker; or a noisy environment.

7. The method of claim 1, wherein an input of the at least one processing device is a noisy audible signal from at least one in-ear microphone, and an output is a most probable noise-free sound signal that would have produced an observed in-ear signal.

8. The method of claim 1, wherein the generative network comprises at least one of: a generative adversarial network, a deep regret analytic generative adversarial network, a Wasserstein generative adversarial network or a progressive growing of generative adversarial networks.

9. The method of claim 1, wherein the generative network comprises at least one of: an auto-encoder or an autoregressive model.

10. The method to claim 2, further comprising:

applying a switch to the at least one real sample pair and the at least one fake sample pair prior to processing by the discriminator network.

11. A method, comprising:

accessing, by a processing device, an audible signal from at least one microphone;

accessing a pre-trained generative network, wherein the pre-trained generative network is configured to generate an external microphone signal from an in-ear microphone signal;

generating a noise free audible signal based on the audible signal and the pre-trained generative network; and outputting the noise free audible signal.

12. The method of claim 11, wherein generating the noise free audible signal based on the audible signal and the pre-trained generative network further comprises:

receiving, by an outside-the-ear microphone, a room sound transfer of at least one sound source of interest and at least one noise source;

receiving, by an in-ear microphone, an in-body transfer of at least one sound source of interest, the at least one noise source, and an incoming audio source;

performing incoming audio cancellation on an output of the in-ear microphone; and performing deep learning inference based on the output of the incoming audio cancellation, an output of the outside-the-ear microphone and a pre-trained deep learning model to determine the noise free audible signal.

13. The method of claim 11, further comprising:

transmitting the noise free audible signal, wherein the noise free audible signal is configured to be received and played by a headphone.

14. The method of claim 11, wherein the audible signal comprises human speech.

15. An apparatus, comprising:

at least one processor; and at least one non-transitory memory including computer program code, the at least one memory and the computer program code configured, with the at least one processor, to cause the apparatus at least to:

access an audible signal including at least one in-ear microphone audible signal and at least one external microphone audible signal, at least one noise signal;

train a generative network to generate an enhanced external microphone signal from an accessed in-ear microphone signal based on the at least one in-ear microphone audible signal and the at least one external microphone audible signal; and output parameters for the generative network based on the training of the generative network.

16. The apparatus of claim 15, wherein, when training the generative network, the at least one memory and the computer program code is further configured, with the at least one processor, to cause the apparatus at least to:

transmit at least one real sample pair based on the at least one in-ear microphone audible signal;

generate at least one fake sample pair based on processing the at least one in-ear microphone audible signal via a conditioned generator network; and process the at least one real sample pair and the at least one fake sample pair via a discriminator network to determine gradients of error to be used in training the generative network.

17. The apparatus of claim 15, wherein the apparatus further comprises:

at least one in-ear microphone and at least one outside-the-ear microphone.

18. The apparatus of claim 15, wherein the at least one real in-ear microphone audible signal and the at least one external microphone audible signal are selected to include at least one of:

different people;

different types of sounds;

a quiet environment including a plugged or an open headset;

a quiet environment including sound from an in-ear speaker and no sound from an in-ear speaker; anord a noisy environment.

19. An apparatus, comprising:

at least one processor; and at least one non-transitory memory including computer program code, the at least one memory and the computer program code configured, with the at least one processor, to cause the apparatus at least to:

receive, by an outside-the-ear microphone, a room sound transfer of at least one audio signal of interest and at least one noise signal;
receive, by an in-ear microphone, an in-body transfer of at least one audio signal of interest and the at least one noise signal, and an incoming audio signal;
perform incoming audio cancellation on an output of the in-ear microphone; and
perform deep learning inference based on an output of the incoming audio cancellation, an output of the outside-the-ear microphone and a pre-trained deep learning model to determine a noise-free natural sound.

20. The apparatus of claim 19, wherein the noise-free natural sound comprises human speech.

* * * * *